United States Patent
Nakamura et al.

[11] Patent Number: 6,108,811
[45] Date of Patent: Aug. 22, 2000

[54] ERROR-CORRECTING DECODER CONTINUOUSLY ADDING FLAG SIGNALS TO LOCATIONS PRECEDING A FIRST LOCATION AT WHICH A DIFFERENCE BETWEEN PATH METRICS IS LOWER THAN THE THRESHOLD

[75] Inventors: Takahiko Nakamura; Hideo Yoshida; Hachiro Fujita, all of Tokyo, Japan

[73] Assignee: Mitsubishi Denki Kabushiki Kaisha, Tokyo, Japan

[21] Appl. No.: 08/944,292

[22] Filed: Oct. 6, 1997

[30] Foreign Application Priority Data

Oct. 18, 1996 [JP] Japan .................................. 8-276209
Sep. 3, 1997 [JP] Japan .................................. 9-238374

[51] Int. Cl.⁷ .............................................. H03M 13/00
[52] U.S. Cl. ............................................ 714/795; 714/796
[58] Field of Search ............................. 386/68; 714/784, 714/792, 795, 755, 796; 370/253; 705/57; 395/705; 455/134

[56] References Cited

U.S. PATENT DOCUMENTS

| | | | |
|---|---|---|---|
| 4,653,052 | 3/1987 | Doi et al. ................................. | 714/755 |
| 4,969,207 | 11/1990 | Sakamoto et al. ....................... | 455/134 |
| 5,136,698 | 8/1992 | Okamoto ................................. | 395/705 |
| 5,229,767 | 7/1993 | Winter et al. ............................ | 341/50 |
| 5,408,531 | 4/1995 | Nakajima ................................. | 705/57 |
| 5,465,267 | 11/1995 | Todoroki ................................. | 375/279 |
| 5,530,708 | 6/1996 | Miya ........................................ | 714/795 |
| 5,544,170 | 8/1996 | Kasahara ................................. | 370/253 |
| 5,586,128 | 12/1996 | Chen ....................................... | 714/792 |
| 5,712,861 | 1/1998 | Inoue et al. ............................. | 714/755 |
| 5,715,262 | 2/1998 | Gupta ...................................... | 714/784 |
| 5,819,001 | 10/1998 | Kim et al. ................................ | 386/68 |

FOREIGN PATENT DOCUMENTS 5235784  9/1993  Japan .

Primary Examiner—Trinh L. Tu
Assistant Examiner—David Ton

[57] ABSTRACT

In an error-correcting decoder, in which an input digital signal including reliability information is decoded by using a Viterbi algorithm as a first decoding process and a final decoded result is obtained by block-code decoding as a second decoding process, a flag signal is added to a location where a value of reliability of path metric determined by the Viterbi algorithm is lower than a threshold, as an original flagged location. A flag signal adding unit continuously adds flag signals to locations, from the original flagged location to locations preceding the originally flagged location, after back tracing. The flagged locations are then regarded as erasure locations in the block-code decoding process.

20 Claims, 22 Drawing Sheets

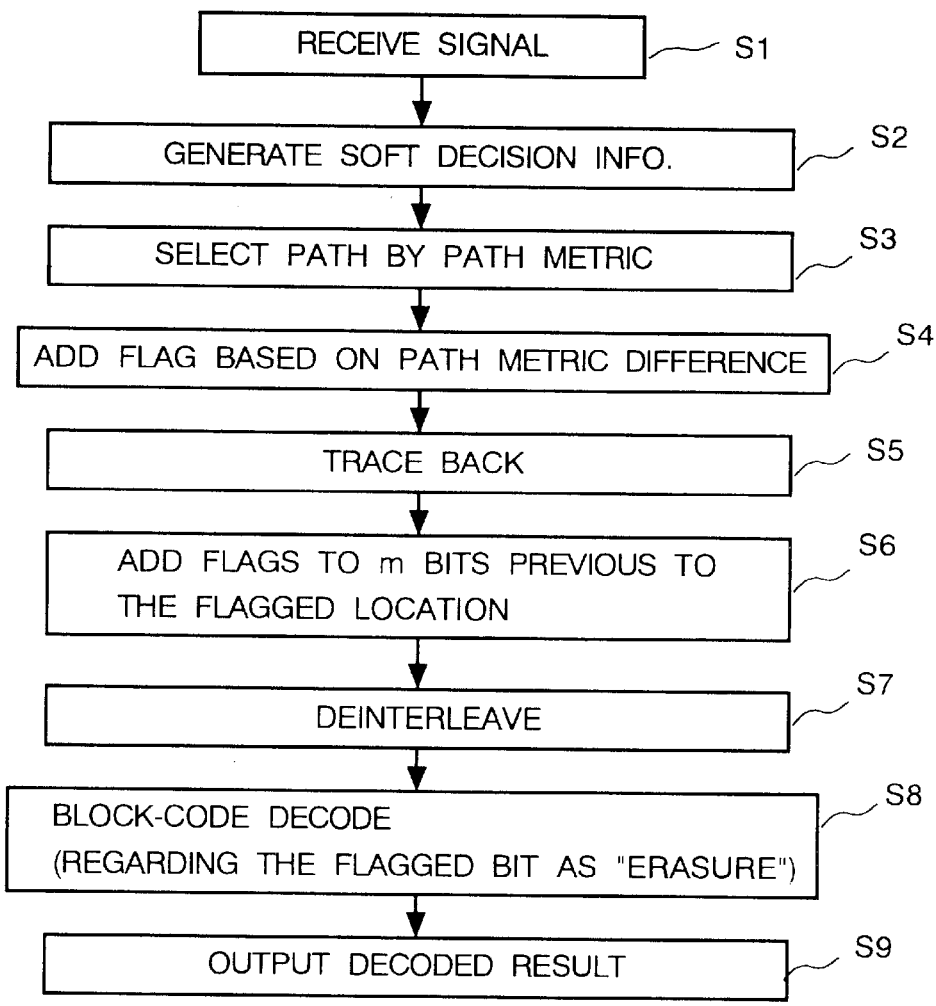
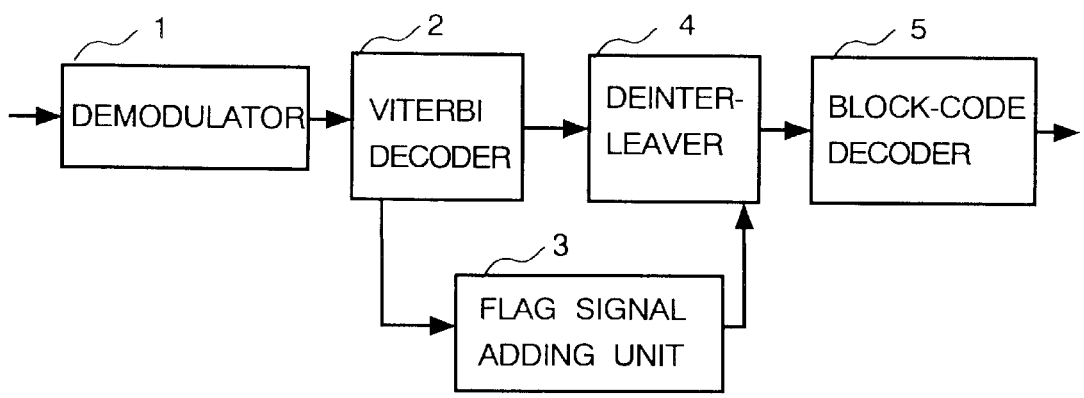

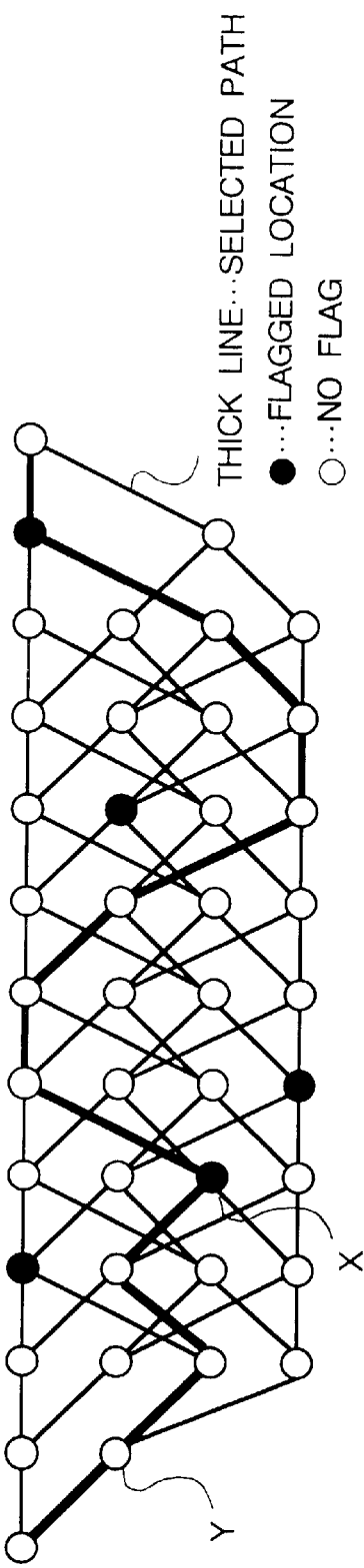
Fig.2A
THICK LINE...SELECTED PATH
●...FLAGGED LOCATION
○...NO FLAG
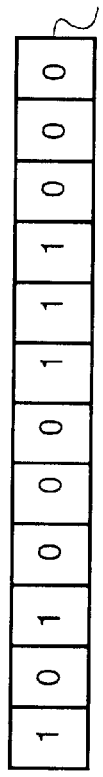
Fig.2B OUTPUT BIT SERIES AFTER VITERBI DECODING
Fig.2C OUTPUT FLAG SERIES AFTER VITERBI DECODING
(F REPRESENTS A FLAGGED BIT LOCATION)
Fig.2D OUTPUT FLAG SERIES FROM FLAG ADDING PART
(FLAGS ARE ADDED TO TWO PREVIOUS BITS)

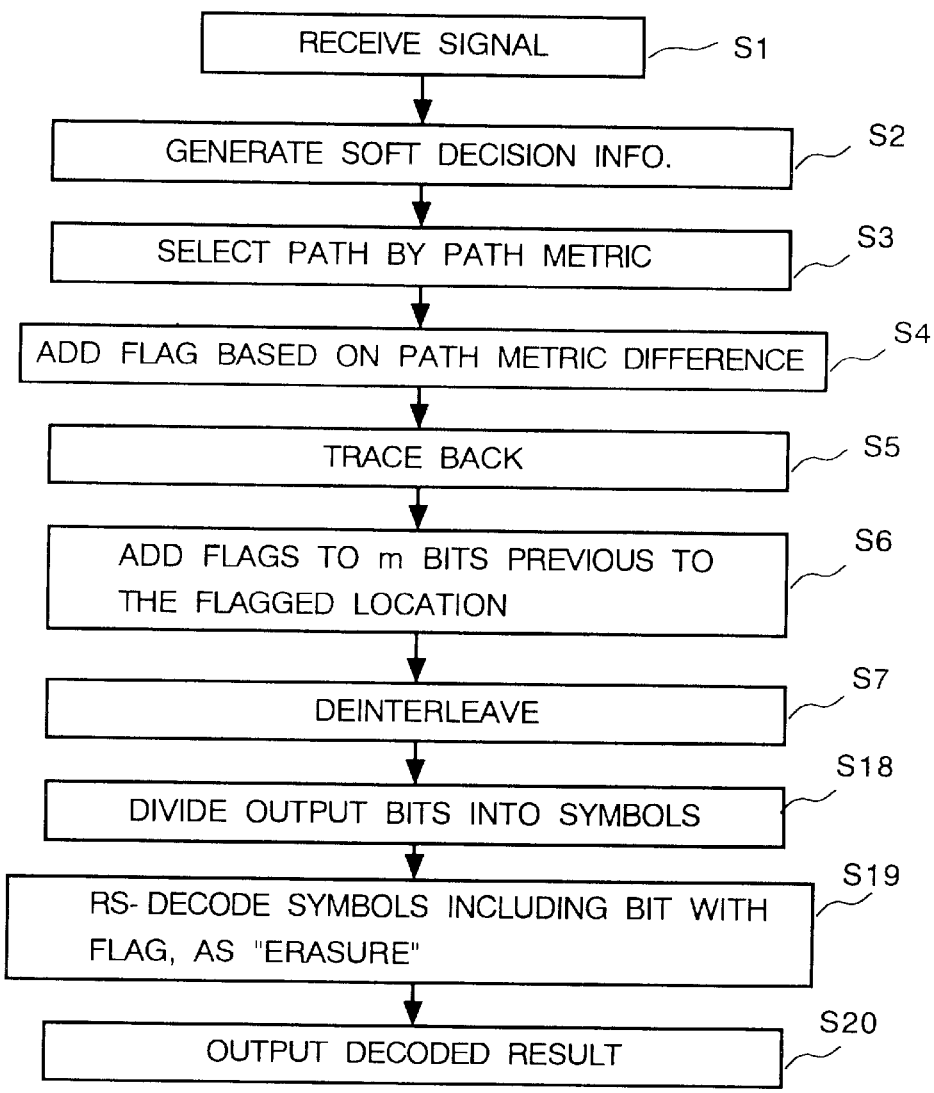
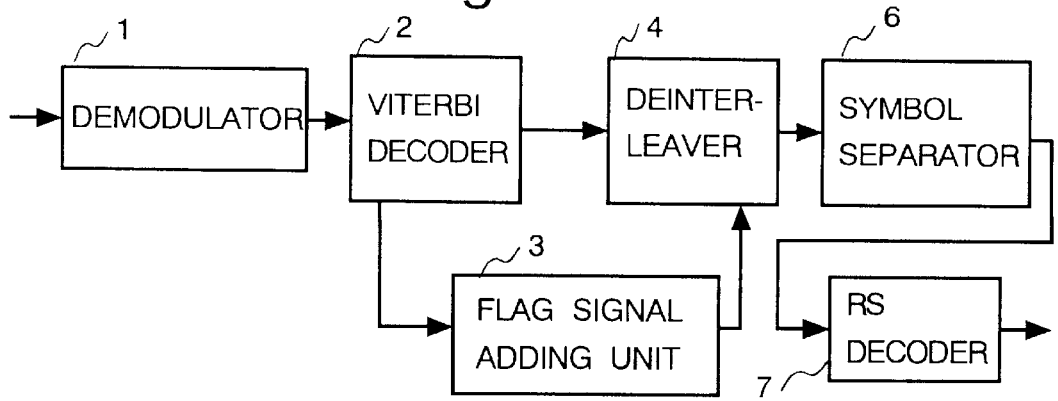

Fig.4A | 1 | 0 | 1 | 0 | 0 | 0 | 1 | 1 | 1 | 0 | 0 | 0 | 1 | 1 | 0 — OUTPUT BIT SERIES AFTER VITERBI DECODING

Fig.4B | | | F | | | | | | | F | | | | | — OUTPUT FLAG SERIES AFTER VITERBI DECODING (F REPRESENTS FLAGGED BIT LOCATION)

Fig.4C | F | F | F | | | | | F | F | F | | | | | — OUTPUT FLAG SERIES FROM FLAG ADDING PART (FLAGS ARE ADDED TO TWO PREVIOUS BITS)

Fig.4D | 101 | 000 | 111 | 000 | 110 | 110 — OUTPUT SYMBOL SERIES AFTER DIVIDING INTO SYMBOLS (ONE SYMBOL COMPOSED OF THREE BITS)

Fig.4E | F | F | F | F | | — FLAG SERIES PER SYMBOL (F REPRESENTS FLAGGED SYMBOL LOCATION)

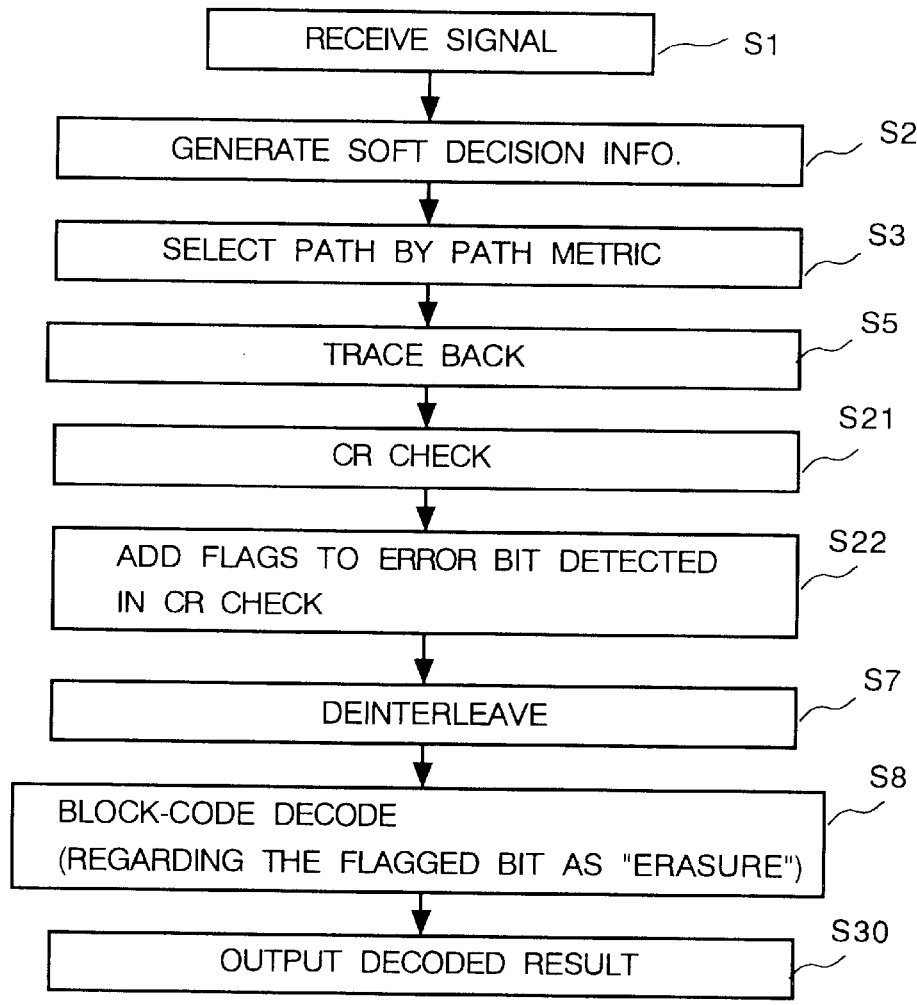
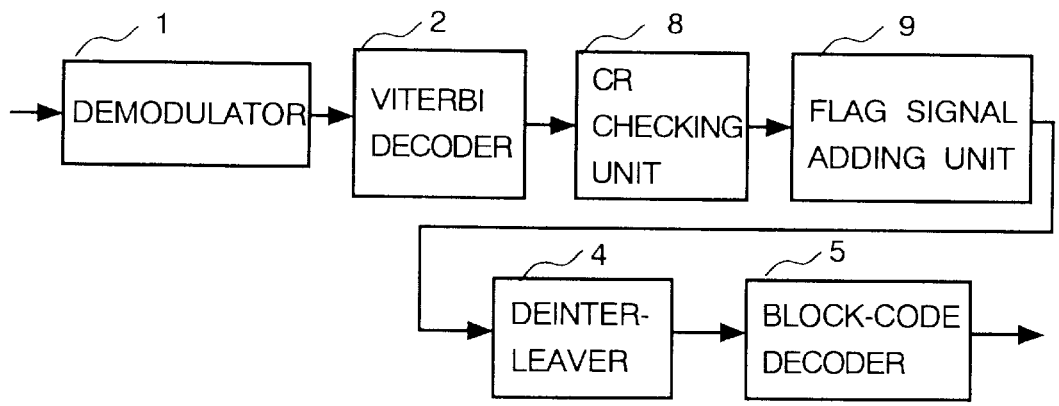

Fig.8A  | 1 | 0 | 1 | 0 | 0 | 0 | 1 | 1 | 0 | 0 |  OUTPUT BIT SERIES AFTER VITERBI DECODING

Fig.8B  | 8 | 5 | 7 | 1 | 0 | 5 | 6 | 5 | 8 | 4 | 2 | 9 |  EXAMPLE OF OUTPUT PATH METRIC DIFFERENCE AFTER VITERBI DECODING

Fig.8C  | 5.6 | 5.1 | 6.7 | 2.6 | 0.9 | 3.6 | 5.2 | 5.2 | 7.2 | 4.9 | 3.0 | 7.1 |  EXAMPLE OF DETERMINED RELIABILITY INFO. BASED ON PATH METRIC

Fig.8D  |  | F | F |  |  |  |  |  |  | F |  |  |  OUTPUT FLAG SERIES FROM FLAG ADDING PART

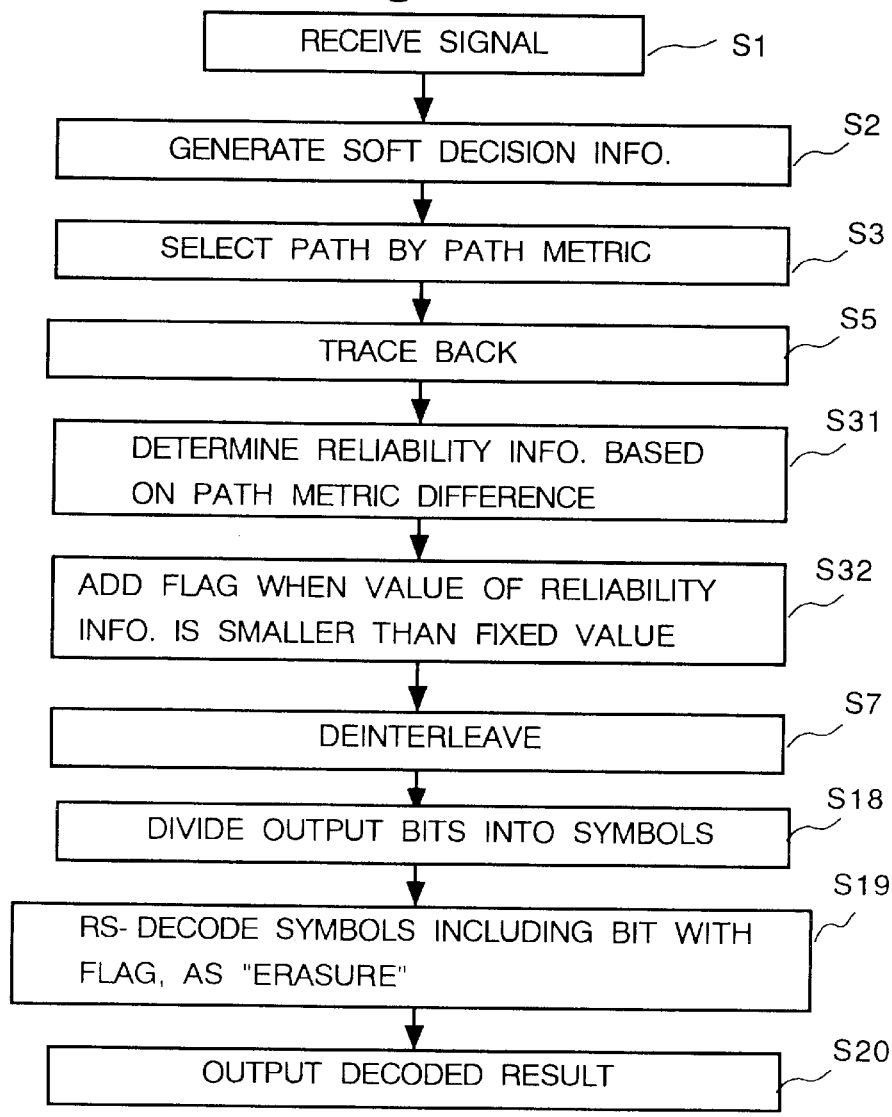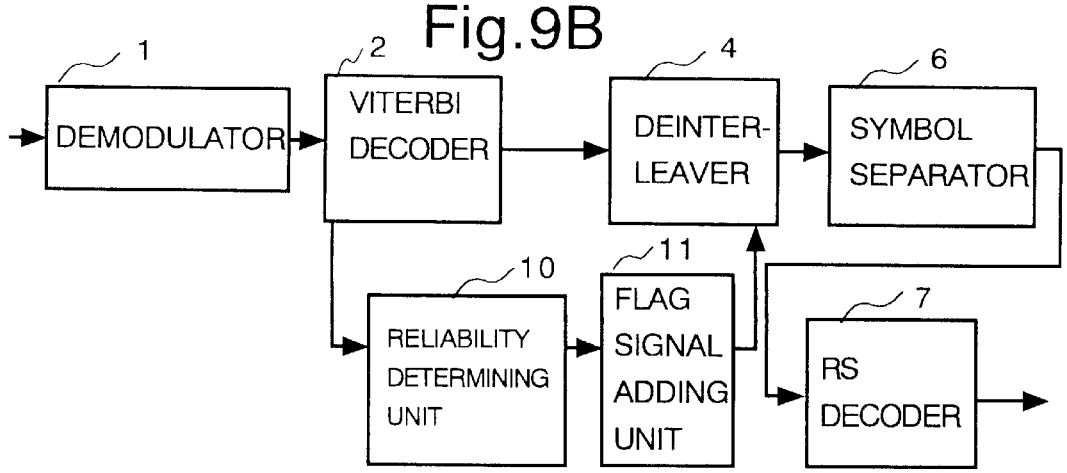

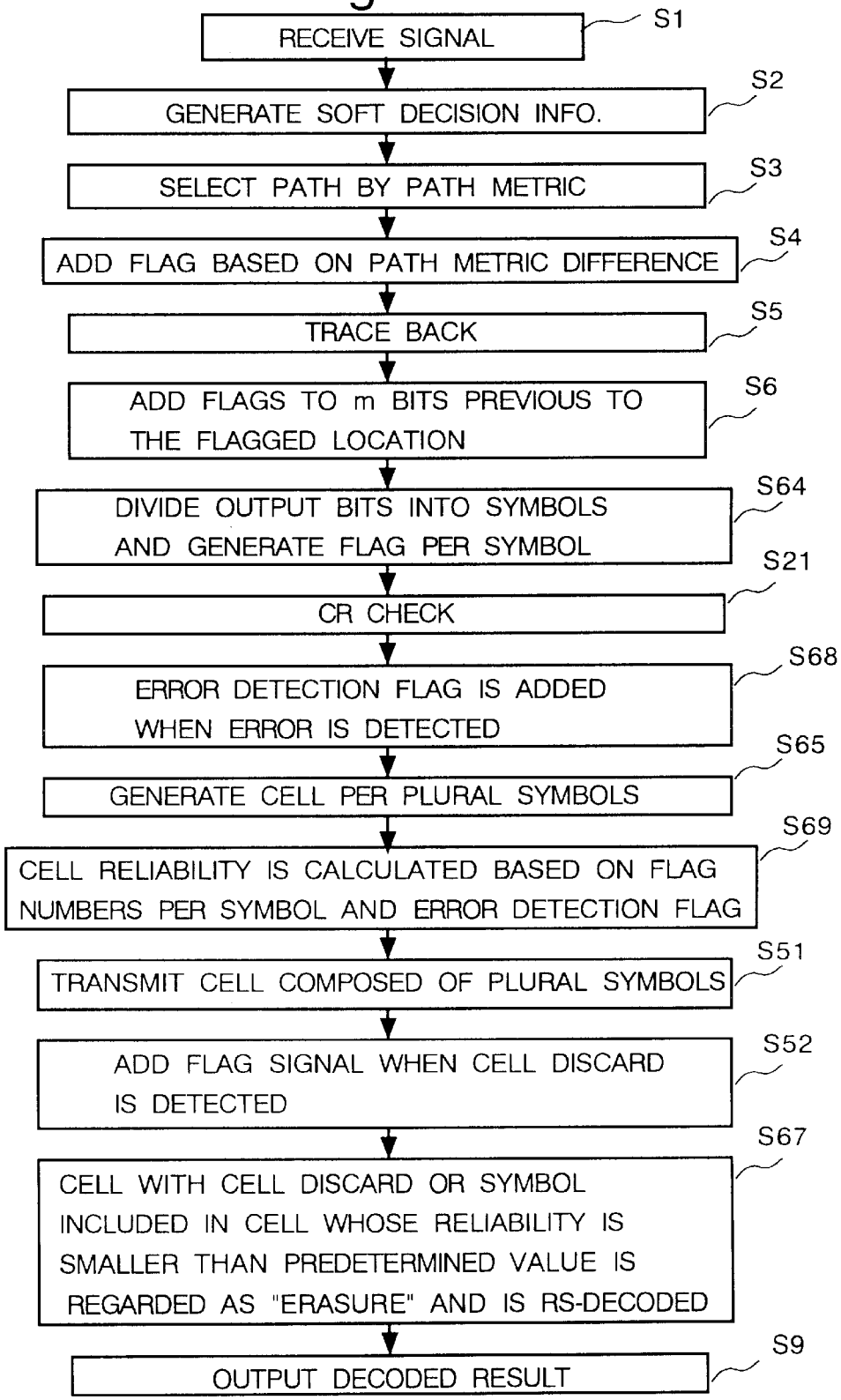

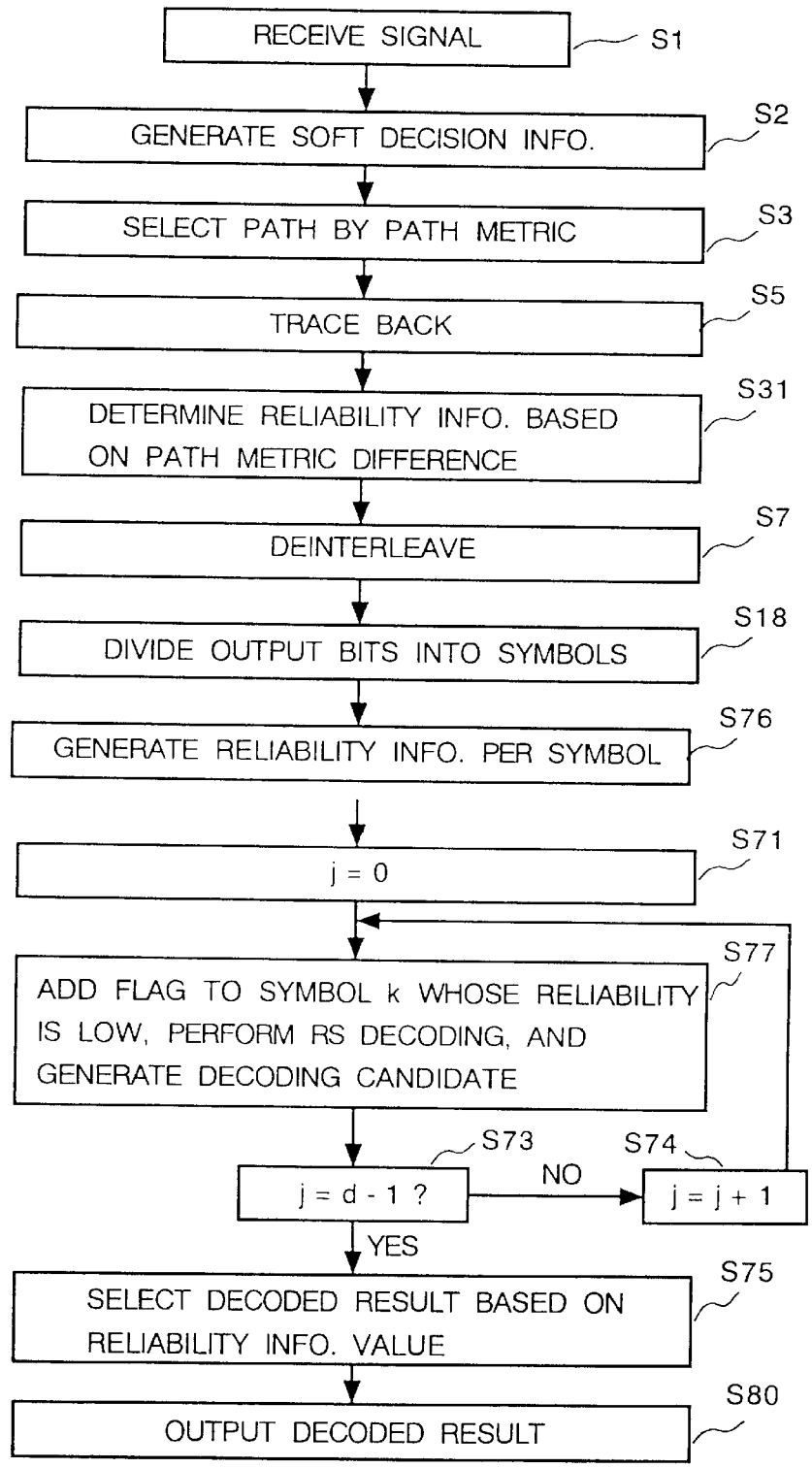

ERROR-CORRECTING DECODER CONTINUOUSLY ADDING FLAG SIGNALS TO LOCATIONS PRECEDING A FIRST LOCATION AT WHICH A DIFFERENCE BETWEEN PATH METRICS IS LOWER THAN THE THRESHOLD

BACKGROUND OF THE INVENTION

1. Field of the Invention

The present invention relates to an error-correcting decoder apparatus and method for correcting errors generated in digital radio communications and others.

2. Description of the Related Art

FIG. 20 of the accompanying drawings is a block diagram showing a conventional error-correcting decoder for concatenated codes disclosed in Unexamined Japanese Patent Publication No. 5-235784. In FIG. 20, an RS (Reed Solomon) encoder 101, an interleaver 102, a convolutional encoder 103, a transmission path 104, a convolutional decoder 105, a first deinterleaver 106, a comparator 107, a second deinterleaver 108, and an RS decoder 109 are shown. The RS encoder 101 adds an RS-code check symbol to the data. The interleaver 102 interleaves the transmission order of RS-encoded data. The convolutional encoder 103 convolutionally encodes data output from the interleaver 102 and the transmission path 104 transmits the data. The convolutional decoder 105 convolutionally decodes its output data and outputs data reliability information at the same time. The first deinterleaver 106 deinterleaves data output from the convolutional decoder 105. The comparator 107 compares the reliability information output from the convolutional decoder 105 with a threshold. The second deinterleaver 108 deinterleaves a signal output from the comparator 107. The RS decoder 109 RS-decodes data output from the first deinterleaver 106, based on an output signal from the second deinterleaver 108 as error-generated location information, and outputs the RS-decoded data.

Operations regarding a signal received through the transmission path 104 will be described below. Path selection is performed by the convolutional decoder 105 and a series of convolutionally decoded bits is output. At this time, the value of a path metric for the latest output data is output as reliability information. The path metric value is compared with a fixed threshold at the comparator 107. When the comparator 107 determines that the value of the reliability information is lower than the fixed threshold, the output data corresponding to the reliability information is regarded as "erasure". Then, decoded data output from the convolutional decoder 105 is deinterleaved at the first deinterleaver 106. Information on "erasure" is deinterleaved at the second deinterleaver 108 and error-correcting based on the "erasure" information is performed at the RS decoder 109. Then, a result of the error-correction is output from the RS decoder 109.

With the configuration described above, the conventional error-correcting decoder for concatenated codes has the following problem. Because the whole data is regarded as "erasure" due to convolutional decoding, the whole data is RS-decoded even when some part of the data has high reliability. Therefore, a rate of erasure symbols which are for correct parts is high. Consequently the efficiency of correction using the "erasure" is deteriorated.

SUMMARY AND OBJECTS OF THE INVENTION

An object of the present invention is to solve the above problem with the following: In a second decoding procedure of the present invention, a flag signal is added only to a result highly believed to be erroneous, out of Viterbi-decoded results. Therefore, since the rate of erasure symbols for correct parts is reduced, the error correction capacity of the error-correcting decoder is improved.

According to one aspect of the present invention of an error-correcting decoder which performs Viterbi-decoding for an input digital signal by using a Viterbi algorithm, comprises:

flag signal adding means for adding a flag signal to a first location where a difference between path metrics in the Viterbi algorithm is lower than a threshold, and for continuously adding flag signals to locations preceding the first location as determined by back tracing; and a block-code decoder for block-code decoding the Viterbi-decoded signal wherein the block-code decoder performs block-code decoding by regarding the locations flagged by the flag signal adding means as erasure locations.

According to another aspect of the present invention of the error-correcting decoder which performs Viterbi-decoding for an input digital signal by using a Viterbi algorithm, comprises:

reliability determining means for determining a specific reliability depending on a difference between path metrics in the Viterbi-decoding;

flag signal adding means for adding a flag signal to a location where the reliability determined by the reliability determining means is lower than a threshold; and a block-code decoder for block-code decoding the Viterbi-decoded signal wherein the block-code decoding is performed by regarding the location flagged by the flag signal adding means as an erasure location.

According to another aspect of the present invention of the error-correcting decoder which performs Viterbi-decoding for an input digital signal by using a Viterbi algorithm, comprises:

reliability determining means for determining a location reliability depending on a difference between path metrics in the Viterbi-decoding;

a plurality of bit inverting means for inverting a predetermined number of bits having low reliabilities as determined by the reliability determining means;

a block-code decoder for block-code decoding the Viterbi-decoded signal; and decoded output selecting means for selecting a decoded output from the block-code decoder whose total value of the location reliability is the lowest based on results of the block-code decoding performed by the block-code decoder.

According to one aspect of the present invention, a decoding method for error-correcting an input digital signal comprises the steps of:

Viterbi-decoding an input digital signal by using a Viterbi algorithm;

selecting a path having a high reliability, based on a path metric in the Viterbi decoding step;

adding a flag signal indicating low reliability to a first location where a difference between path metrics is lower than a threshold;

specifying a path which is most likely to be reliable, by back tracing using the Viterbi algorithm in the Viterbi-decoding step;

continuously adding flag signals indicating low reliability to locations preceding the first location; and block-code decoding by regarding the first location with the flag signal and the locations preceding the first location having the flag signals as erasure locations.

According to another aspect of the present invention, the decoding method for error-correction comprises the steps of:

Viterbi-decoding an input digital signal by using a Viterbi algorithm;

selecting a path having a high reliability, based on a path metric in the Viterbi-decoding step;

specifying a path which is most likely to be reliable, by back tracing using the Viterbi-decoded algorithm in the Viterbi-decoding step;

determining a reliability based on a difference between path metrics at each location;

adding a flag signal indicating low reliability to a first location where a determined reliability is lower than a threshold; and block-code decoding the Viterbi-decoded signal by regarding the first location with the flag signal as an erasure location.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1A shows an operation flow of an error-correcting decoder according to Embodiment 1;

FIG. 1B shows a configuration of the error-correcting decoder according to Embodiment 1;

FIG. 2A is a trellis for explaining the operation of the error-correcting decoder shown in FIG. 1B;

FIG. 2B shows a bit series for explaining the operation of the error-correcting decoder shown in FIG. 1B;

FIG. 2C shows a flag signal series for explaining the operation of the error-correcting decoder shown in FIG. 1B;

FIG. 2D shows another flag signal series for explaining the operation of the error-correcting decoder shown in FIG. 1B;

FIG. 3A shows an operation flow of an error-correcting decoder according to Embodiment 2;

FIG. 3B shows a configuration of the error-correcting decoder according to Embodiment 2;

FIG. 4A shows a bit series for explaining the operation of the error-correcting decoder shown in FIG. 3;

FIG. 4B shows a flag signal series for explaining the operation of the error-correcting decoder shown in FIG. 3;

FIG. 4C shows another flag signal series for explaining the operation of the error-correcting decoder shown in FIG. 3;

FIG. 4D shows a symbol series for explaining the operation of the error-correcting decoder shown in FIG. 3;

FIG. 4E shows another flag signal series for explaining the operation of the error-correcting decoder shown in FIG. 3;

FIG. 5A shows an operation flow of an error-correcting decoder according to Embodiment 3;

FIG. 5B shows a configuration of the error-correcting decoder according to Embodiment 3;

FIG. 8A shows a bit series for explaining the operation of the reliability determining unit of FIG. 7B;

FIG. 8B shows path metric differences for explaining the operation of the reliability determining unit of FIG. 7B;

FIG. 8C shows determined reliability information for explaining the operation of the reliability determining unit of FIG. 7B;

FIG. 8D shows a flag signal series for explaining the operation of the reliability determining unit of FIG. 7B;

FIG. 9A shows an operation flow of another error-correcting decoder according to Embodiment 4;

FIG. 9B shows a configuration of the error-correcting decoder of FIG. 9A;

FIG. 17 shows an operation flow of another error-correcting decoder according to Embodiment 9;

FIG. 19A shows an operation flow of another error-correcting decoder according to Embodiment 10;

DESCRIPTION OF PREFERRED EMBODIMENTS

Embodiment 1

Figure 6A:
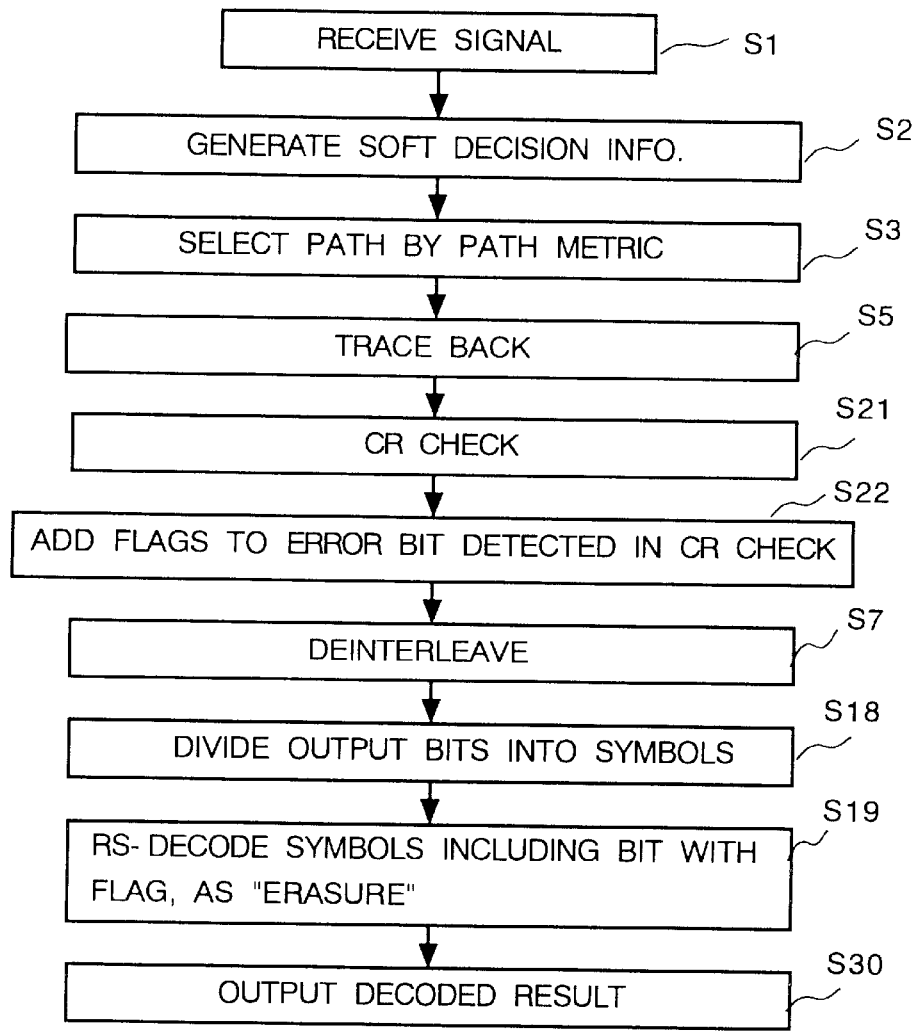
FIG. 6A shows an operation flow of another error-correcting decoder according to Embodiment 3.

An error-correcting decoder for concatenated codes according to the first embodiment of the present invention will now be described. The main point of the present invention is described with reference to the analysis results showing deteriorated reliability in Viterbi decoding. With respect to data segments having low reliability in a trellis of Viterbi decoding, it is believed that the cause of the low reliability does not solely originate from the only path where the low reliability is estimated, but also from paths preceding the original path. Therefore, for the purpose of obtaining an improved decoding result, the present invention adds flag signals to all paths whose reliabilities are low and performs a second decoding with regard to the flagged locations as "erasure locations".

FIG. 1A illustrates an operation flow of error-correcting decoder according to the present embodiment and FIG. 1B shows a configuration of the error-correcting decoder. In FIG. 1B, a demodulator 1, a Viterbi decoder 2 as a first decoder, a flag signal adding unit (means) 3, a deinterleaver 4 for deinterleaving an output from the Viterbi decoder 2, and a block-code decoder 5 having unique performance are shown.

FIG. 2A is a state transition trellis, for explaining the operation of the error-correcting decoder shown in FIG. 1B. In FIG. 2A, the thick line shows a path selected by a back tracing procedure performed by the viterbi decoder 2. The black circle shows a location where a flag signal is added because a path metric difference (accumulated metric-accumulated value) is smaller than a fixed threshold. As shown in FIG. 2A, four states are possible for each location.

Referring to FIGS. 1A, 1B, 2A, 2B, 2C and 2D, the operation will be described below. In the error-correcting decoder configured as shown in FIG. 1B, a signal is received at a step S1 ("step" omitted, hereinafter) in FIG. 1A, and soft decision information for each bit is generated by the demodulator 1 at S2. S3 is a path selecting step, which selects a path having high reliability at the input side of each location in FIG. 2A by using a path metric in Viterbi decoding. The bit series shown in FIG. 2B is output in the case of FIG. 2A. S4 is a flag signal adding step, which adds a flag signal indicating low reliability to a location where a path metric difference is smaller than the fixed threshold. Such flag signals are added to five locations as shown in black circles in FIG. 2A. S5 is a trace back step in Viterbi decoding, which determines hard decision information and then selects a path having the highest probability. Namely, the path shown in the thick line in FIG. 2A is defined by trace back step S5. Furthermore, outputs of the flag signals corresponding to locations having low reliability are shown in FIG. 2C.

When applying Viterbi decoding, the present invention proceeds on the basis that the low reliability because of a path metric difference being smaller than a fixed threshold does not result solely from the only path where the low reliability is determined, but also from some previous paths to the original path, as an accumulated result. Therefore, based on this inference, several paths preceding the location having the low reliability are also assumed to have low reliability.

Accordingly, at a step S6, flag signals are continuously added to locations, from an originally flagged location to specific locations preceding the originally flagged location, by the flag signal adding unit 3. The number of the flag signals added to the specific locations preceding the originally flagged location depends on cases. In FIG. 2A, two more flag signals are added to locations previous to the flagged location X, totally three flag signals are put from the location X. This means that the flagged location X has an accumulated low reliability. Namely, it is assumed that the state of low reliability begins at the location Y. FIG. 2D shows outputs with reference to the above.

S7 is a step for changing the order of the data with the deinterleaver 4. S8 is a block-code decoding step, which regards the continuous flagged locations shown in FIG. 2D as erasure locations when performing block-code decoding by the block-code decoder 5. Then, the last decoded result is obtained and output at S9.

Flag signals are only added to bits which are very likely to be erroneous, consequently the efficiency of second decoding is increased.

Embodiment 2

FIG. 3A illustrates an operation flow of an error-correcting decoder according to the second embodiment and FIG. 3B shows a configuration of the error-correcting decoder. In FIG. 3B, a symbol separator 6 for separating information into symbols composed of plural bits, and a Reed-Solomon (RS) decoder 7 are utilized in place of the block-code decoder 5 of FIG. 1B. The other elements in FIG. 3B, the demodulator 1, the Viterbi decoder 2, the flag signal adding unit 3, and the deinterleaver 4 are substantially equal to the elements correspondingly numbered in Embodiment 1 and shown in FIG. 1B. FIGS. 4A through 4E illustrate process examples performed by the error-correcting decoder of FIG. 3B in the case of receiving a digital signal serial stream of "one symbol for every three bits" shown in FIG. 4A which is similar to FIG. 2B.

The operation of the error-correcting decoder configured as depicted in FIGS. 3A and 3B will now be described. Operations up to the deinterleaver 4 are the same as the operations of Embodiment 1. At S1 through S7, soft decision information is generated, a path is selected by using a path metric, a flag signal is added to a location where a path metric difference is smaller than a fixed threshold, one path is selected by trace back, and flag signals of a predetermined number are added to locations preceding the originally flagged location.

At S18, following S7, output bits are divided into symbols. FIGS. 4A through 4D show an example of the data stream being divided every three bits. The symbol series of FIG. 4D corresponds to states of flag signals in FIG. 4C. At S19 which is performed by the RS decoder 7, if a symbol of three bits has at least one bit with a flag signal, the symbol is regarded as having low reliability, and a flag signal is added to the symbol having low reliability in order to regard the symbol as an erasure location. Thus, symbols with flag signals, including flag signals for previous bits, are continuously regarded as erasure locations. The symbols with flag signals shown in FIG. 4E are decoded as "erasure locations" by RS decoder 7 and a decoded result is obtained at S20.

Because flag signals are added to symbols which are very likely to be erroneous, efficiency of the second decoding process is increased as well as Embodiment 1.

Embodiment 3

FIG. 5A illustrates an operation flow of an error-correcting decoder according to the third embodiment and FIG. 5B shows a configuration of the error-correcting decoder therefore. An object of the present configuration is to enhance reliability. In FIG. 5B, a CR (Cyclic Redundancy) checking unit (means) 8 and a flag signal adding unit (means) 9 are shown. The other elements are substantially similar to the ones correspondingly numbered in Embodiment 1.

Operations S1 through S5 in the error-correcting decoder of the present embodiment are the same as the previous embodiments. At S21 in FIG. 5A, CR checking is performed for hard decision information determined by Viterbi decoding. If an error bit is detected in CR check of S21, then at S22 in FIG. 5A, a flag signal is added to the error bit by the flag signal adding unit 9. Viterbi decoding, CR checking and flag signal adding are repeatedly performed for data received one by one. At S7 in FIG. 5A, the order of the hard decision information and the order of added flag signals are changed by the deinterleaver 4. At S8, the bits with the flag signals are secondly decoded to be regarded as "erasure locations" by the block-code decoder 5. Then, the final decoded data is output at S30.

Figure 6B:
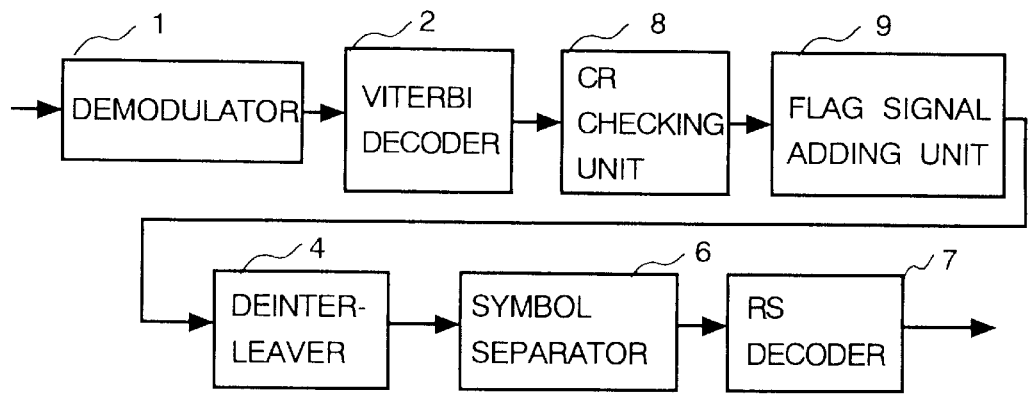
FIG. 6B shows a configuration of the error-correcting decoder of FIG. 6A.

FIG. 6A illustrates an operation flow of another error-correcting decoder according to the present embodiment. FIG. 6B shows a configuration of the error-correcting decoder. Some parts in FIG. 6B are the same as the ones in FIG. 5B except that FIG. 6B is for error-correcting of symbols.

The configuration and the operation of the present error-correcting decoder will be omitted because elements having the same reference numbers have been already explained in Embodiments 2 and 5. Explaining each step in the operation flow is also omitted because it has already been described in the previous embodiments.

According to the present configuration, it is possible to add a flag signal only to a bit series where an error is obviously generated, consequently the efficiency of the second decoding is increased.

Embodiment 4

Figure 7A:
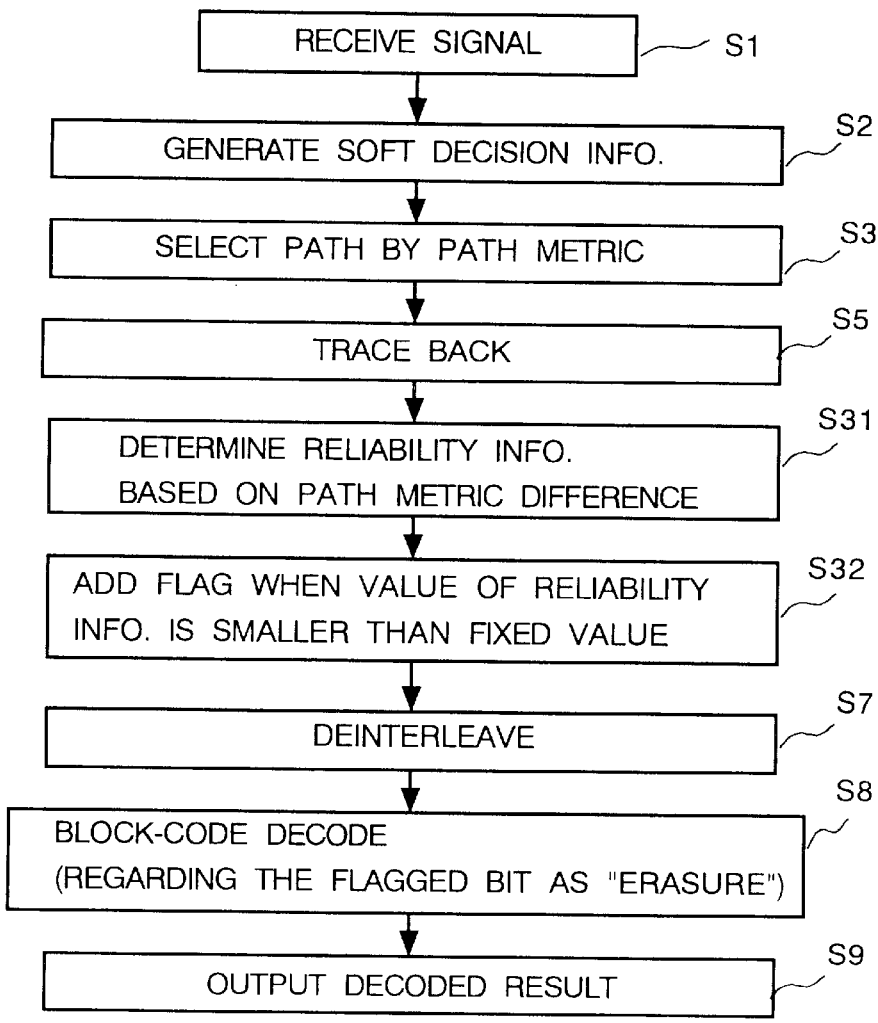
FIG. 7A shows an operation flow of an error-correcting decoder according to Embodiment 4.
Figure 7B:
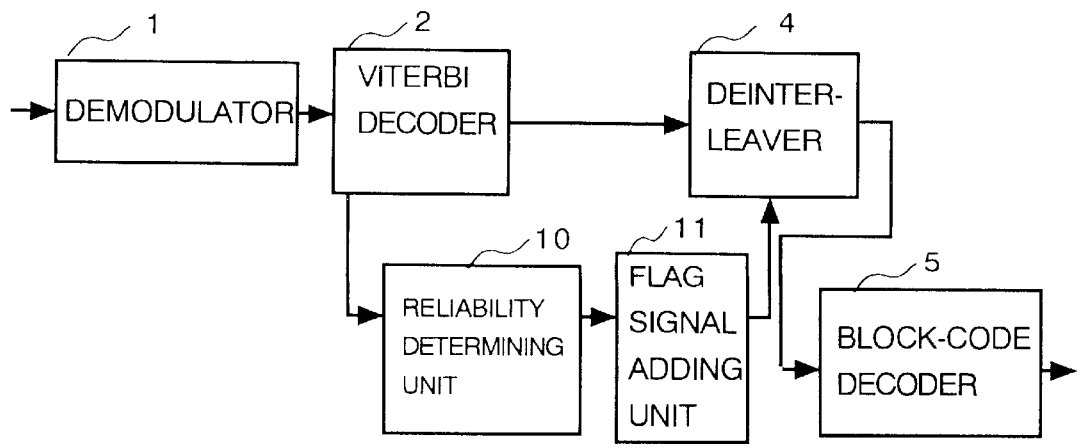
FIG. 7B shows a configuration of the error-correcting decoder according to Embodiment 4.

FIG. 7A illustrates an operation flow of an error-correcting decoder according to the fourth embodiment and FIG. 7B shows a configuration of the error-correcting decoder. In FIG. 7B, a reliability determining unit (means) 10 and a flag signal adding unit (meas) 11 are shown. The other elements are equal to the ones correspondingly numbered in Embodiment 1. FIGS. 8A, 8B, 8C and 8D explain the operation of the reliability determining unit 10. An example of output bits at each location after Viterbi decoding is shown in FIG. 8A, and an example of information corresponding to the output bits is shown in FIGS. 8B, 8C and 8D.

Operations will be described below. Operations S1 through S5 are the same as the ones in the previous embodiments. At S31 in FIG. 7A, reliability information is determined against a result of Viterbi decoding. For instance, path metric differences shown in FIG. 8B are calculated against output bit series of FIG. 8A. Then, determining reliability information to be "p", a path metric difference to be "s", and reliability information of ith bit to be "p(i)", "p" can be calculated by using the following formula:

$$p(i)=0.7s(i)+0.2s(i-1)+0.1s(i-2)$$

Therefore, the reliability information shown in FIG. 8C can be determined.

A threshold for reliability information indicates the lowest level, more than which no error is likely generated in a selected path. Namely, in the case of a value of reliability information being less than the threshold, there is an error possibility in the selected path. An amount of the value, less than which an error can be likely generated in the selected path, depends on the situation. In the case of this embodiment, a flag signal is added to information of a location whose reliability is less than a fixed value of 3.5, at S32 in FIG. 7A. The flag signal series shown in FIG. 8D is obtained by the above procedures.

FIG. 9A illustrates an operation flow of another error-correcting decoder according to the present embodiment. FIG. 9B shows a configuration of the error-correcting decoder. Some parts in FIG. 5B are the same as the ones in FIG. 7B except that FIG. 9B is for error-correcting of symbols.

The description of the operation of the present error-correcting decoder is omitted, because the operation is readily apparent to one of ordinary skill in the art by referring to the operational description for the error-correcting decoder in the previous embodiments.

Embodiment 5

Figure 10A:
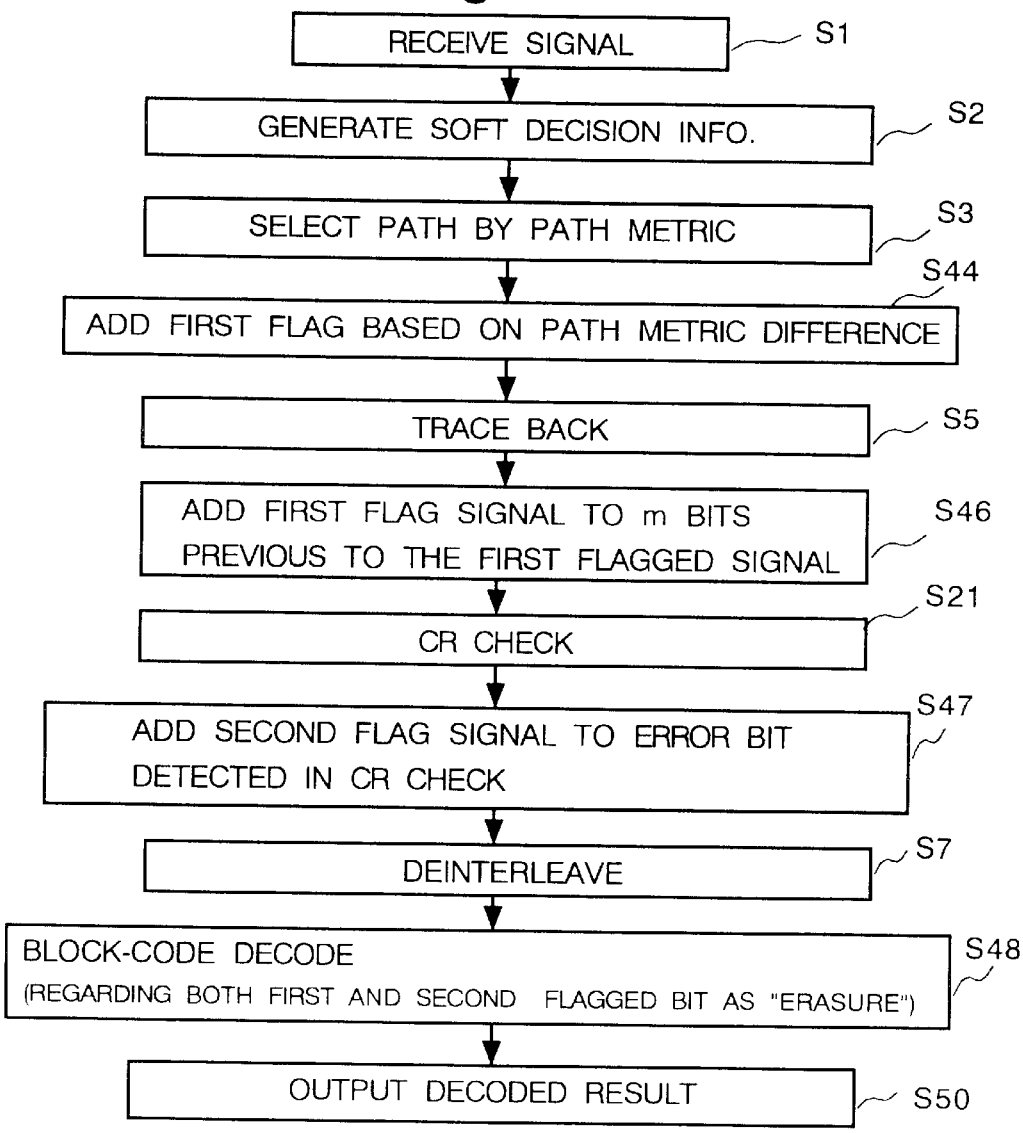
FIG. 10A shows an operation flow of an error-correcting decoder according to Embodiment 5.
Figure 10B:
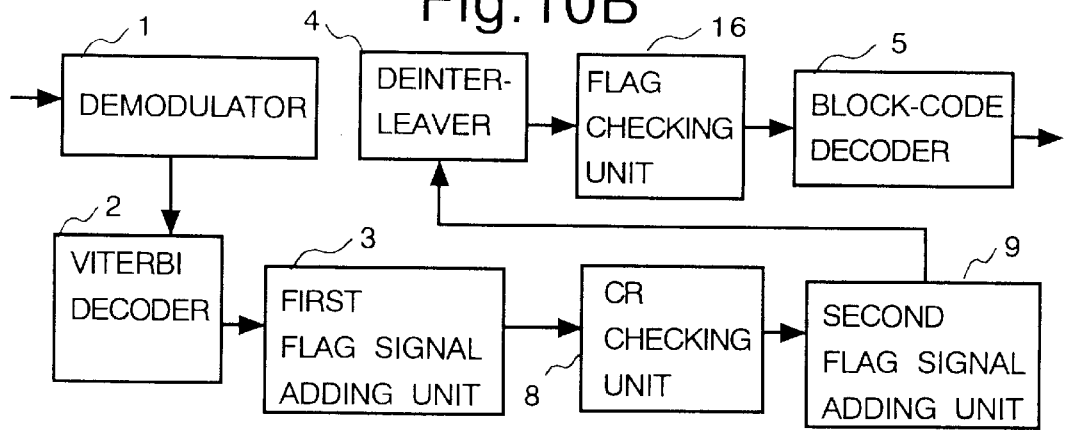
FIG. 10B shows a configuration of the error-correcting decoder according to Embodiment 5.

FIG. 10A illustrates an operation flow of an error-correcting decoder according to the fifth embodiment and FIG. 10B shows a configuration of the error-correcting decoder. In FIG. 10B, a flag signal checking unit (means) 16 and a second flag signal adding unit 9 are shown, and the other elements are equal to the ones correspondingly numbered in the previous embodiments except that the flag signal adding unit 3 is labelled as a first flag signal adding unit 3. The operation will be described below with reference to FIG. 10A. The present embodiment is a combination of the configurations in Embodiment 1 and Embodiment 3. If there is a bit where a path metric difference is smaller than a fixed threshold, a first flag signal is added to the bit at S44 in FIG. 10A and first flag signals are also added to a predetermined number of previous bits at S46 in FIG. 10A by the first flag signal adding unit 3. Then at S47, when an error is detected by CR checking in S21, a second flag signal is added by second flag signal adding unit 9 to the bit where the error was detected by the CR checking.

The above operations are repeated for data received one by one. Then, the order of hard decision information, the first flag signal and the second flag signal is changed by the deinterleaver 4.

At S48, a bit with both the first flag signal and the second flag signal is regarded as an erasure location by the flag signal checking unit 16 because reliability of the bit is low, and is decoded by the block-code decoder 5. Then, the final decoded data is output at S50.

Figure 11A:
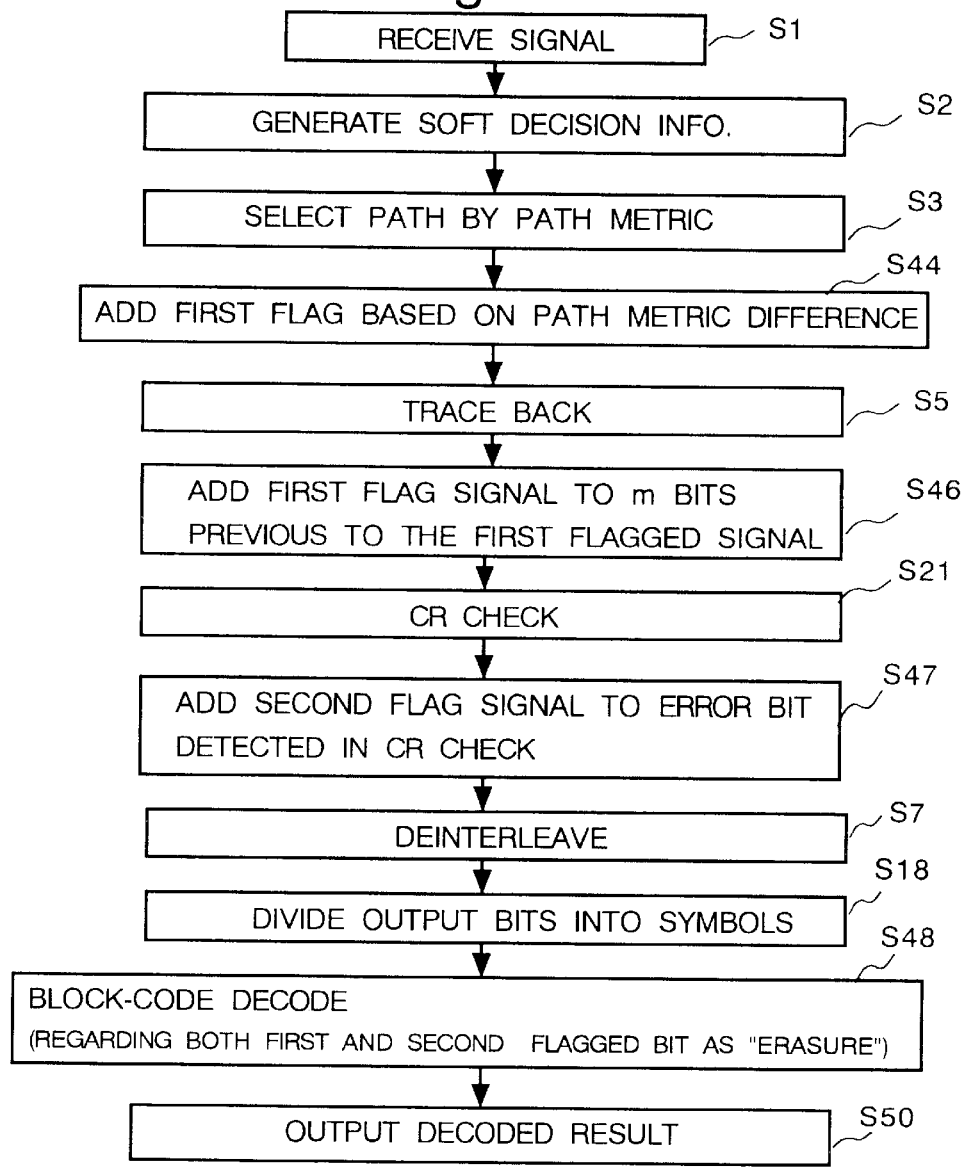
FIG. 11A shows an operation flow of another error-correcting decoder according to Embodiment 5.
Figure 11B:
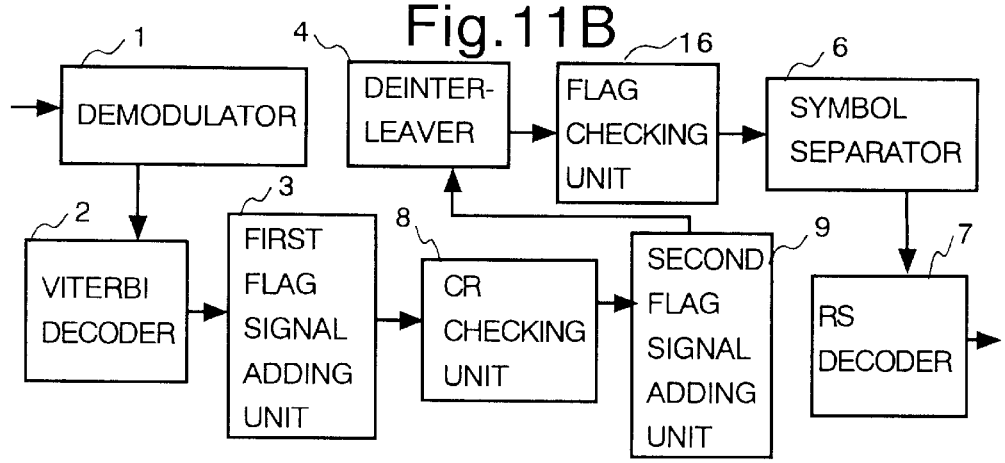
FIG. 11B shows a configuration of the error-correcting decoder of FIG. 11A.

FIG. 11A illustrates an operation flow of another error-correcting decoder according to the fifth embodiment. FIG. 11B shows a configuration of the error-correcting decoder, which is a combination of the configurations in Embodiment 2 and Embodiment 3.

Describing operations of the present error-correcting decoder will be omitted because the operations are readily apparent to one of ordinary skill in the art by referring to the operations of the present embodiment and the previous embodiments.

According to the present configuration, it is possible to add a flag signal only to a bit whose error likelihood is high, out of bits to which flag signals are added in Embodiment 3. In this way, the efficiency of the second decoding is increased.

Embodiment 6

Figure 12:
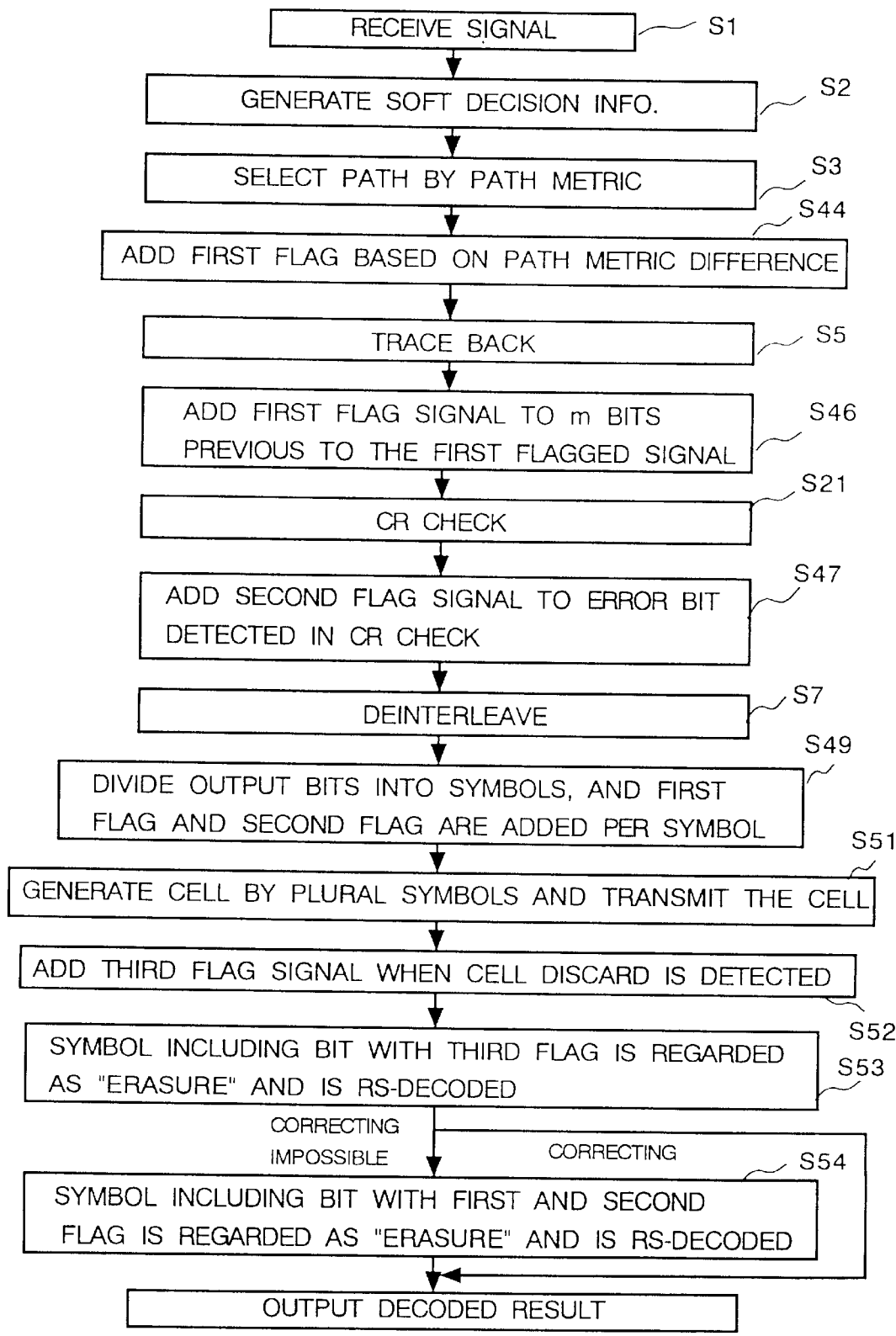
FIG. 12 shows an operation flow of an error-correcting decoder according to Embodiment 6.
Figure 13:
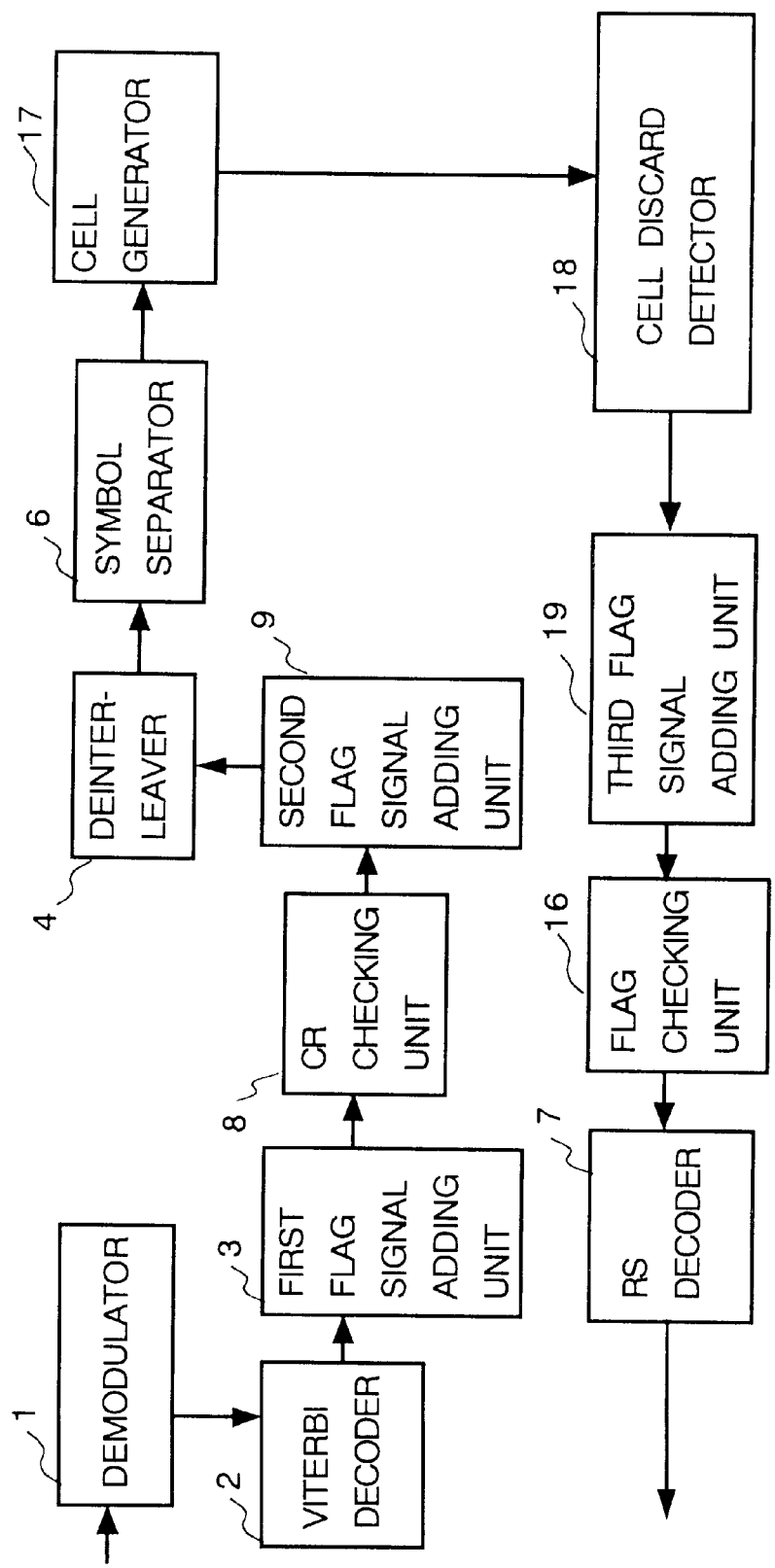
FIG. 13 shows a configuration of the error-correcting decoder according to Embodiment 6.

FIG. 12 illustrates an operation flow of an error-correcting decoder according to the sixth embodiment and FIG. 13 shows a configuration of the error-correcting decoder therefore. In FIG. 13, a cell generator (generating means) 17, a cell discard detector (detecting means) 18, and a third flag signal adding unit (means) 19 are shown. The cell discard detector 18 receives a cell and detects a cell discard of the cell. The other elements are substantially similar to the ones correspondingly numbered in the previous embodiments.

Referring to FIG. 12, the operation of the error-correcting decoder according to the sixth embodiment will be described below. The case where a transmission by cell is performed after an error of the first decoding process is corrected will be explained in the present embodiment.

At S49 in FIG. 12, output bits are divided into symbols by the symbol separator 6 in FIG. 13, and a first flag signal and a second flag signal per symbol are generated by first and second flag signal adding units 3 and 9. At S51 in FIG. 12, the cell generator 17 in FIG. 13 generates a cell by collecting plural symbols as data and transmits the cell. At S52, the cell discard detector 18 adds a third flag signal when a cell discard is detected. At S53, only a symbol including a bit with the third flag signal indicating a cell discard is first regarded as an erasure location during decodation by the RS decoder 7. If error-correcting by the RS-decoder 7 is impossible, the symbol flagged at both S44 and S47 is regarded as an erasure location, and is RS-decoded at S54. Accordingly, the efficiency of the second decoding for correcting errors can be enhanced by using a cell discard detection.

Embodiment 7

Figure 14:
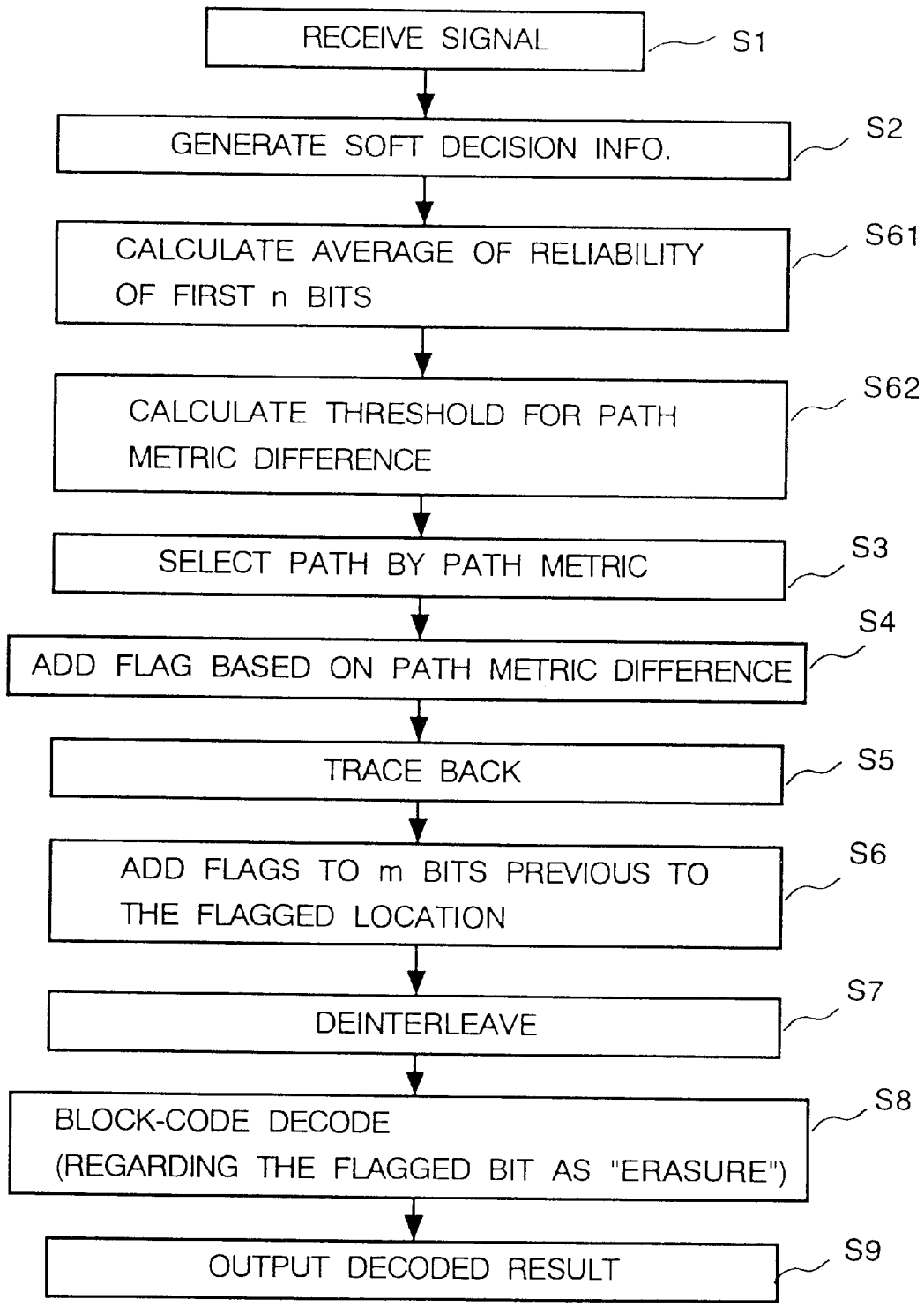
FIG. 14 shows an operation flow of an error-correcting decoder according to Embodiment 7.

FIG. 14 illustrates an operation flow of an error-correcting decoder according to the seventh embodiment. The configuration of the error-correcting decoder which operates as shown in FIG. 14 is the same as that of FIG. 1. In addition, the error-correcting decoder of FIG. 14 includes a reliability-average calculating unit (means) for estimating a fixed threshold of reliability information by calculating an average value of reliabilities of n bits, in the flag signal adding unit, for instance.

The operation of the error-correcting decoder, including the operation of the part for estimating a fixed threshold of reliability information, will now be described below.

At S61 in FIG. 14, an average value of reliabilities of fixed bits (eg. the first n bits), as shown in FIG. 8C, is calculated by using the reliability-average calculating unit. At S62, a threshold for path metric difference is calculated. Namely, the threshold is a standard for determining whether a flag signal is added or not. Once the threshold is determined, operations performed after the threshold determining are substantially the same as the operations performed in Embodiment 1. According to the above, it is possible to adjust the number of bits to which flag signals are added, depending upon the current state of the transmission line. Therefore, the efficiency of the second decoding is enhanced.

Embodiment 8

Figure 15:
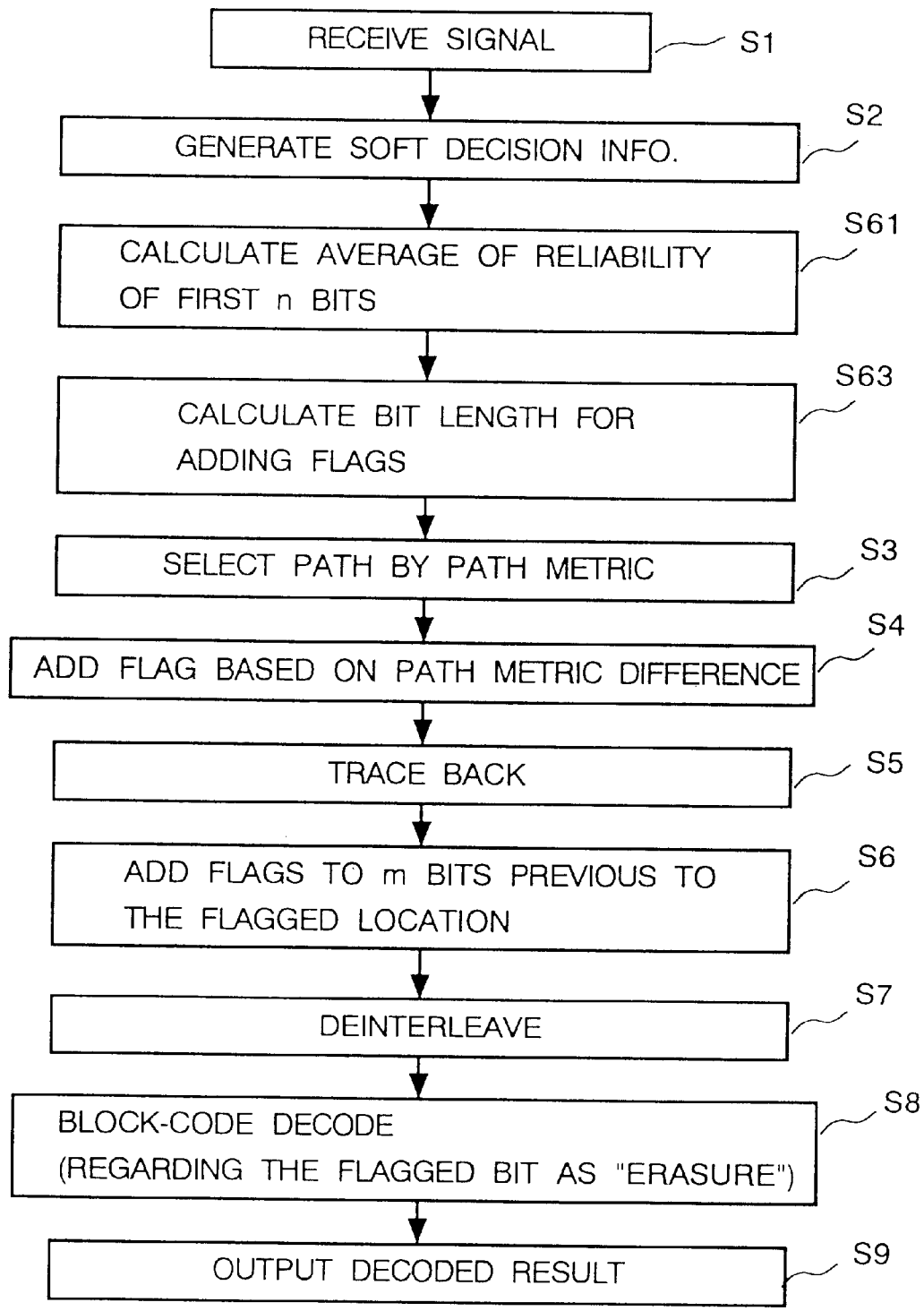
FIG. 15 shows an operation flow of an error-correcting decoder according to Embodiment 8.

FIG. 15 illustrates an operation flow of an error-correcting decoder according to the eighth embodiment. The configuration of the error-correcting decoder which operates as shown in FIG. 15 is the same as that of FIG. 1. In addition thereto, the error-correcting decoder of FIG. 15 includes a part for calculating and defining a length of flag signals which are added for previous bits, in the flag signal adding unit 3, for instance.

At S61 in FIG. 15, an average value of reliabilities of predetermined bits (the first n bits, for instance) is calculated. If the reliability is low, S63 extends the length of flag signals which are added for previous bits.

Then, once the bit length for adding flag signals is defined at S63, subsequent operations are substantially the same as the operations performed by Embodiment 1. According to the above, it is possible to adjust the number of bits to which flag signals are added, depending upon the current state of the transmission line. Therefore, the efficiency of the second decoding is enhanced.

Embodiment 9

Figure 16:
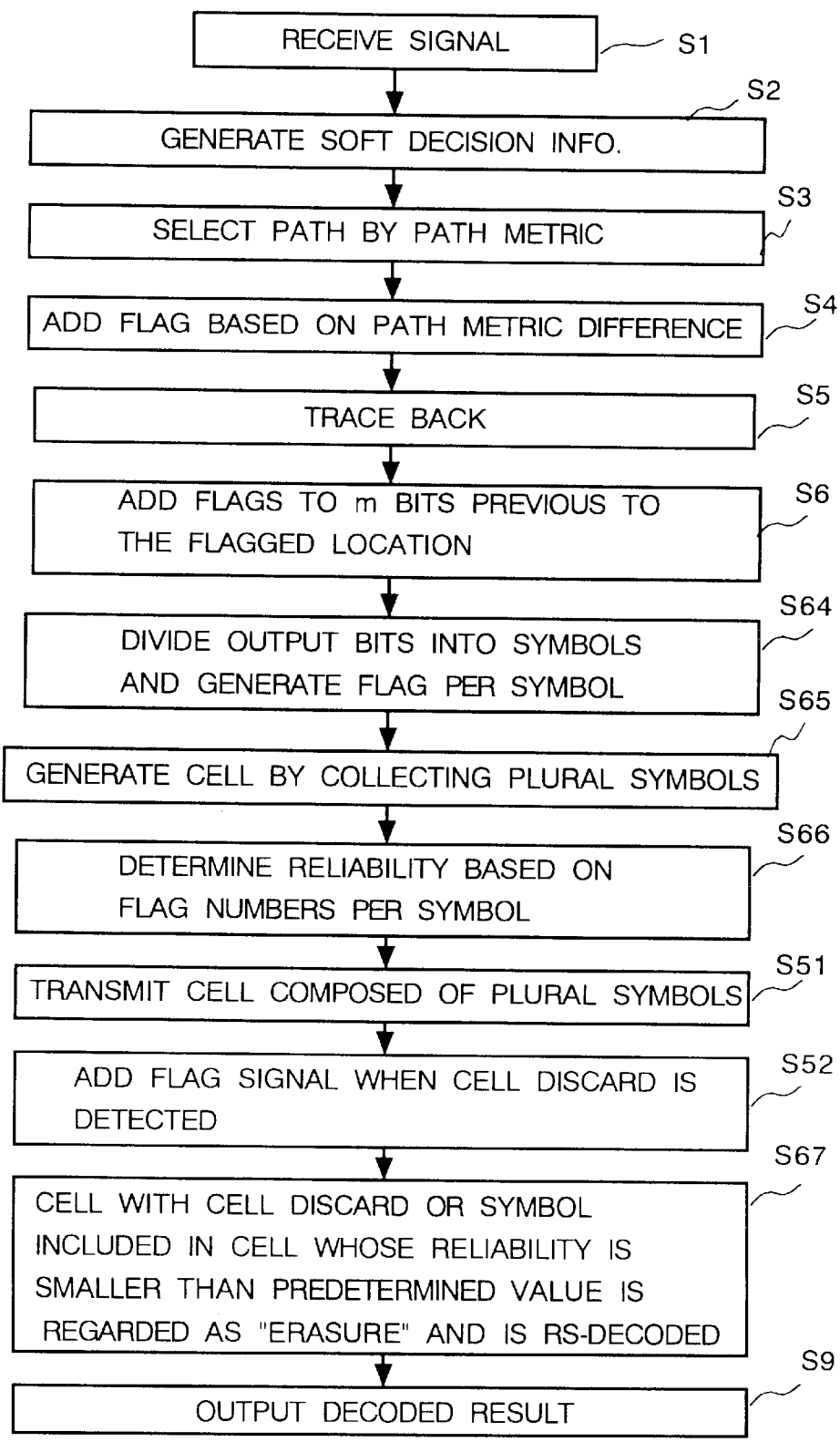
FIG. 16 shows an operation flow of an error-correcting decoder according to Embodiment 9.

FIG. 16 illustrates an operation flow of an error-correcting decoder according to the ninth embodiment. At S64 in FIG. 16, output bits are divided into symbols and a flag signal per symbol is generated. At S65, a cell is generated by collecting plural symbols. Then, at S66, reliability per cell is calculated based on the number of flag signals, for instance. A cell whose reliability is less than a predetermined reliability, that is a cell with flag signals of more than a predetermined number, and symbols included in a cell wherein a cell discard is generated are all regarded as erasure locations, and RS-decoded at S67.

FIG. 17 shows an operation flow of another error-correcting decoder according to the ninth embodiment. FIG. 17 is an operation flow in the case of combining the error-correcting decoder of Embodiment 3 where a CR check is performed and the error-correcting decoder of the present embodiment. At S68, if an error is detected, an error detection flag signal is added. At S69, reliability of a cell is calculated based on the number of flag signals per symbol and the error detection flag signal. According to the above, the second decoding can be effectively performed by just transmitting a small amount additional information.

Embodiment 10

Figure 18A:
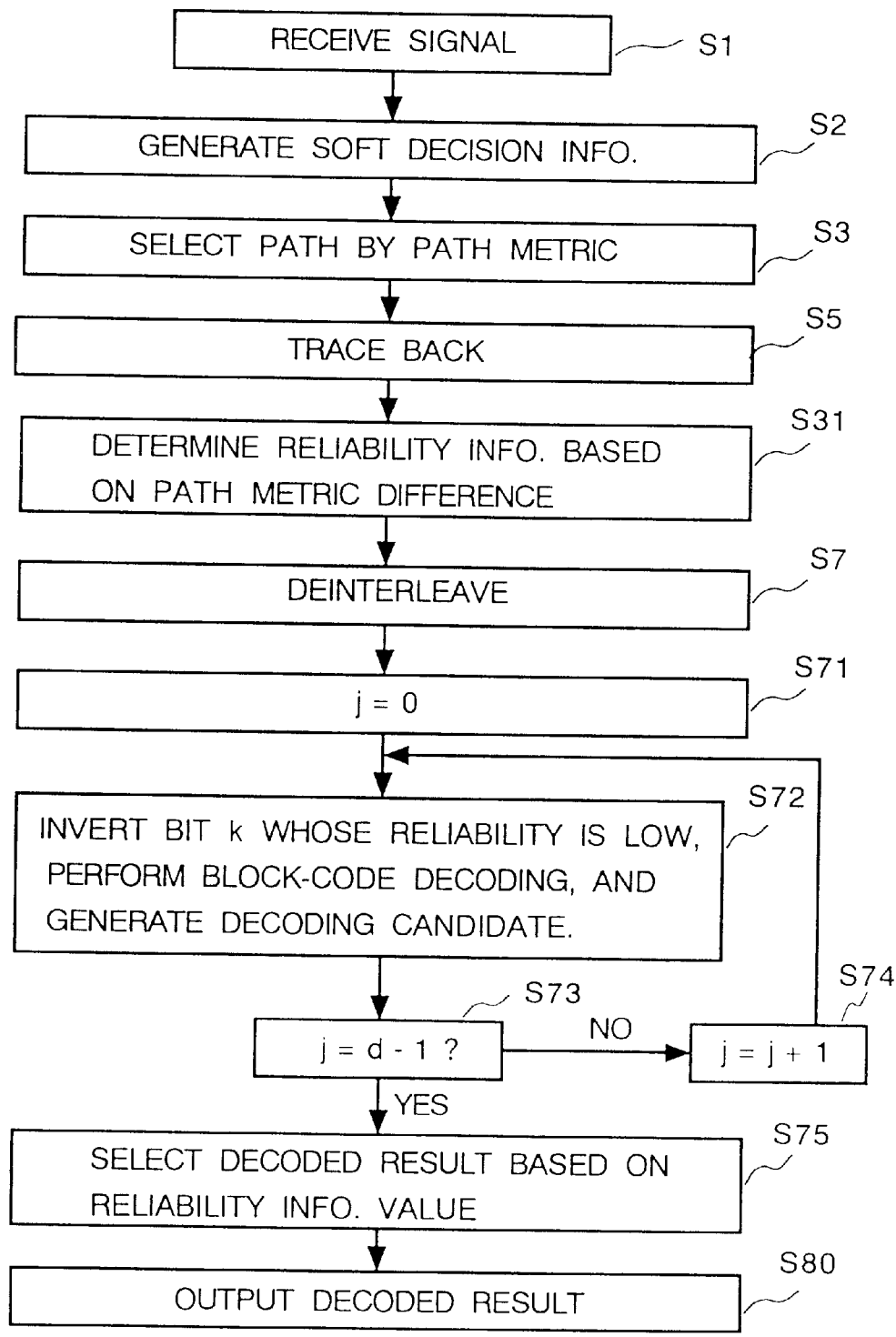
FIG. 18A shows an operation flow of an error-correcting decoder according to Embodiment 10.
Figure 18B:
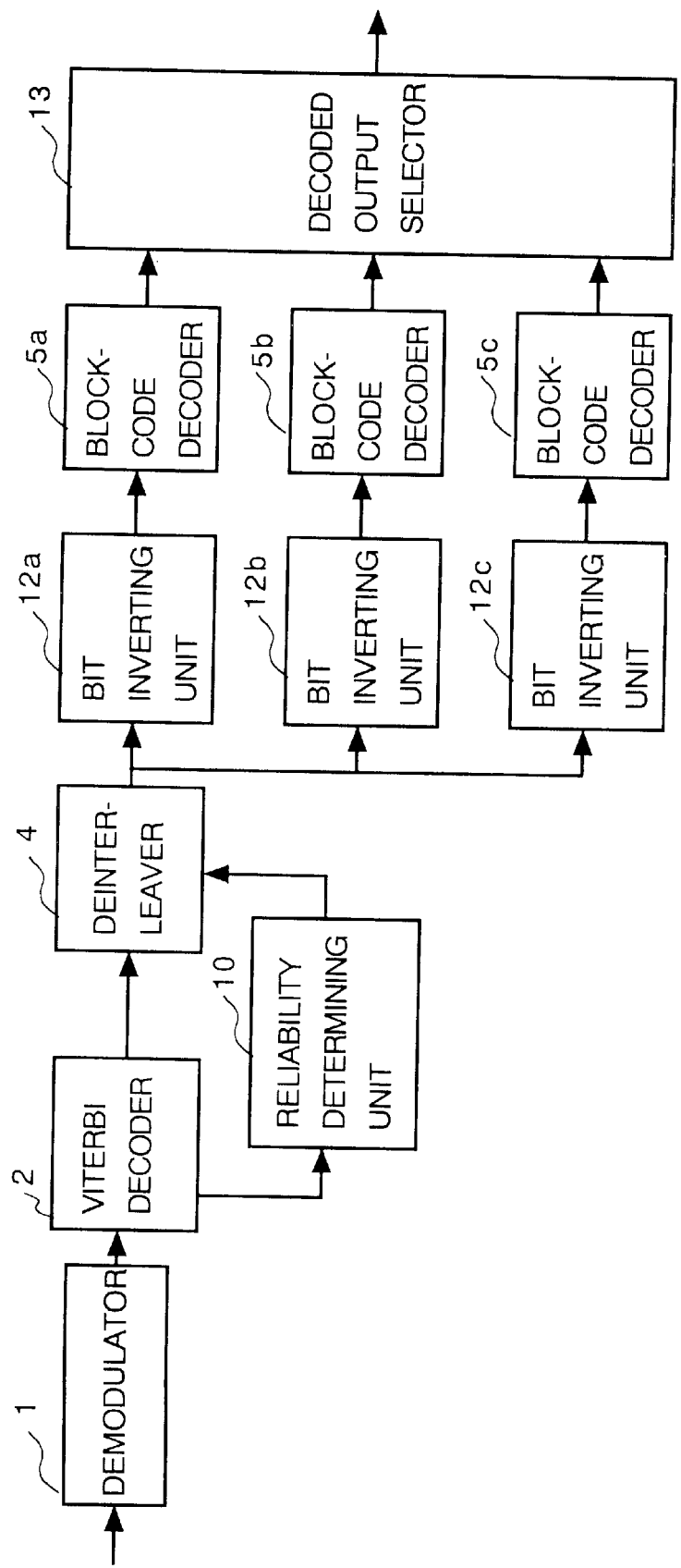
FIG. 18B shows a configuration of the error-correcting decoder according to Embodiment 10.

FIG. 18A illustrates an operation flow of error-correcting decoder according to the tenth embodiment and FIG. 18B shows a configuration of the error-correcting decoder. In FIG. 18B, bit inverting units (means) 12a, 12b and 12c and a decoded output selector (selecting means) 13 for selecting the most likely result decoded by block-code decoders 5a, 5b and 5c are shown. The other elements are equal to the ones correspondingly numbered in the previous embodiments. Referring to FIG. 18A, the operation of the error-correcting decoder according to the present embodiment will be described below.

Operations S1 through S5, namely from receiving an input signal to the first decoding by the Viterbi decoder 2, in the error-correcting decoder of the present embodiment are the same as the ones in the previous embodiments. S31 In FIG. 18A determines reliabilities, such as the ones in FIG. 8. S31 can determine this reliability information by utilizing the reliability determining unit 10 as described in Embodiment 4. Then, after S7 performs deinterleaving by utilizing the deinterleaver 4, the number of bits selected in the order of the levels of reliability (from low to high) is determined to be "j" (0<=j<=shortest distance d). At S72 in FIG. 18A, a bit having low reliability is compulsorily inverted by the bit inverting parts 12a, 12b and 12c. In this case, the bit inverting parts 12a, 12b and 12c respectively invert k−1 bit, k bit, and k+1 having low reliabilities, for instance. At S75, the decoded output selector 13 selects a corrected bit whose total value of reliability information is the lowest, based on decoded results by the block-code decoders 5a, 5b and 5c. Then, the final decoded result is output at S80.

Figure 19B:
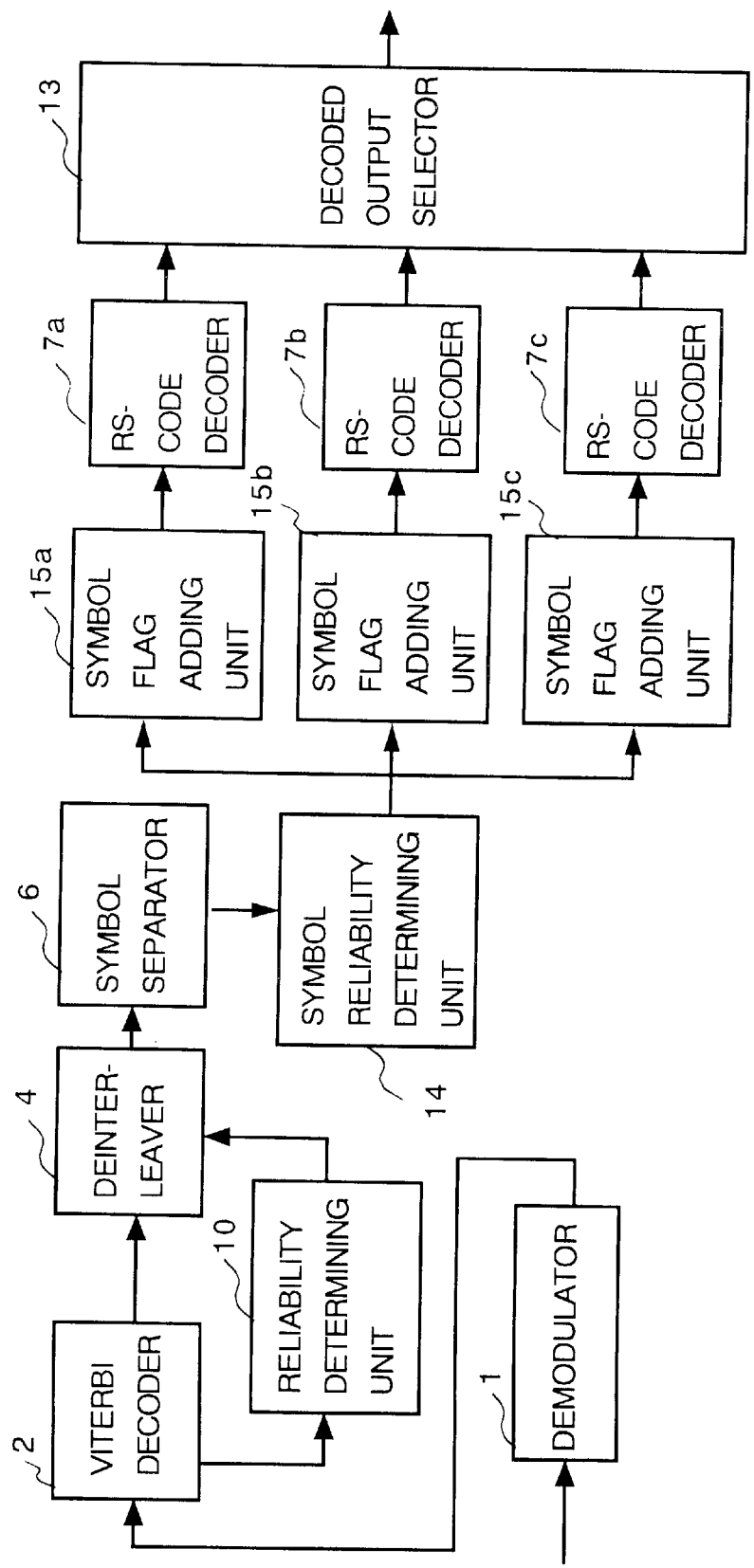
FIG. 19B shows a configuration of the error-correcting decoder of FIG. 19A.
Figure 20:
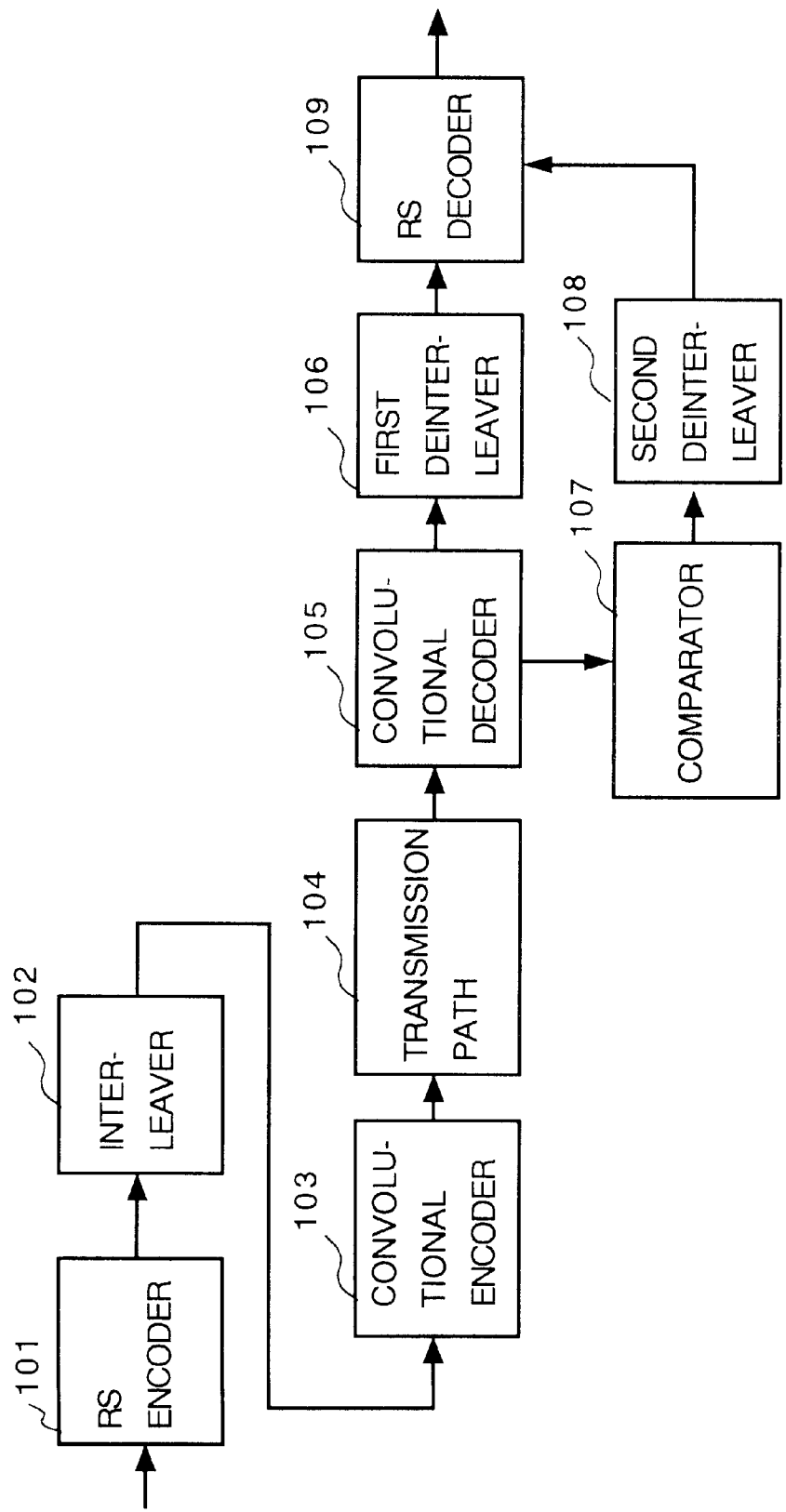
FIG. 20 is a block diagram showing a conventional error-correcting decoder for concatenated codes.

FIG. 19A illustrates an operation flow of another error-correcting decoder according to the present embodiment and FIG. 19B shows a configuration of the error-correcting decoder. In FIG. 19B, a symbol reliability determining unit (means) 14 and a symbol flag signal adding units (means) 15a, 15b and 15c are shown. The other elements are equal to the ones correspondingly numbered in the previous embodiments.

Describing detailed operations of the present error-correcting decoder is omitted because the error-correcting decoder of FIG. 19B is a combination of the configurations in Embodiment 2 and the present embodiment.

At S76 in 19A, reliability information per symbol is generated. At S77, a flag signal is added to a symbol k whose reliability is low, in order to perform RS-decoding, and a decoding candidate is generated. Because a candidate whose reliability is the highest can be selected out of plural candidates for second decoding, the efficiency of the second decoding is enhanced.

Having thus described several particular embodiments of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only, and not intended to be limiting. The invention is limited only as defined in the following claims and the equivalents thereto.

What is claimed is:

1. An error-correcting decoder which performs Viterbi-decoding for an input digital signal by using a Viterbi algorithm, comprising:

flag signal adding means for adding a flag signal to a first location where a difference between path metrics in the Viterbi algorithm is lower than a threshold, and for continuously adding flag signals to locations preceding the first location as determined by back tracing; and a block-code decoder for block-code decoding the Viterbi-decoded signal, by regarding the locations flagged by the flag signal adding means as erasure locations.

2. The error-correcting decoder of the claim 1, wherein the input digital signal has plural bits composing a symbol, and wherein the block-code decoder performs RS (Reed-Solomon) decoding using the symbol, in which a symbol including at least one of the flag signals is regarded as an erasure symbol.

3. The error-correcting decoder of the claim 2, further comprising:

cell generating means for generating a cell by collecting symbols composed of plural bits included in the input digital signal; and cell discard detecting means for receiving the cell generated by the cell generating means, detecting a cell discard in order to add a flag signal indicating an erasure location, and informing the block-code decoder of the erasure location for performing the RS decoding.

4. The error-correcting decoder of the claim 2 further comprising:

cell generating means for generating a cell by collecting symbols composed of plural bits included in the input digital signal; and cell discard detecting means for receiving the cell generated by the cell generating means and detecting a cell discard;

wherein a cell having low reliability based on a number of flags in each symbol and a cell including the cell discard are regarded as erasure locations in the RS decoding performed by the block-code decoder.

5. The error-correcting decoder of the claim 1, further comprising:

CR (Cyclic Redundancy) checking means for performing a Cyclic Redundancy Check after the Viterbi decoding, and wherein the flag signal adding means adds a flag signal to a location where an error is detected by the CR checking means.

6. An error-correcting decoder according to claim 1, further comprising:

reliability determining means for determining a specific reliability depending on a difference between path metrics in the Viterbi-decoding;

wherein the flag adding means adds the flag signal to a location where the reliability determined by said reliability determining means is lower than a threshold.

7. An error-correcting decoder according to claim 6, further comprising:

a plurality of bit inverting means for inverting a predetermined number of bits having low reliabilities as determined by said reliability determining means; and decoded output selecting means for selecting a decoded output from the block-code decoder whose total value of the location reliability is the lowest based on results of the block-code decoding performed by said block-code decoder.

8. The error-correcting decoder of the claim 7, wherein the input digital signal has plural bits composing a symbol;

wherein the reliability determining means is a symbol reliability determining means for determining a symbol reliability based on a plurality of the location reliabilities;

a plurality of symbol flag signal adding means for adding flag signals to symbols whose symbol reliabilities are low; and wherein the decoded output selecting means selects a decoded output whose total value of the symbol reliabilities is the lowest based on results of the block-code decoder performing RS decoding.

9. The error-correcting decoder of the claim 1, wherein the flag signal adding means is a first flag signal adding means for adding a first flag signal, the error correcting decoder further comprising:

CR checking means operably coupled to the first flag signal adding means;

second flag signal adding means for adding a second flag signal to a location where an error is detected by the CR checking means; and flag signal checking means for detecting a location flagged with both the first flag signal and the second flag signal, and for outputting the location flagged with both the first flag signal and the second flag signal as an erasure location to the block-code decoder.

10. The error-correcting decoder of the claim 1, further comprising:

reliability-average calculating means for calculating an average of reliabilities of specific locations in the Viterbi decoding, and wherein the flag signal adding means determines the threshold based on the average of reliabilities.

11. The error-correcting decoder of the claim 1, further comprising:

reliability-average calculating means for calculating an average of reliabilities of specific locations in the Viterbi decoding, and wherein the flag signal adding means determines a number of flag signals to be added to the locations preceding the first location, based on the average of reliabilities.

12. A decoding method for error-correcting an input digital signal, comprising the steps of:

Viterbi-decoding an input digital signal by using a Viterbi algorithm;

selecting a path having a high reliability, based on a path metric in the Viterbi decoding step;

adding a flag signal indicating low reliability to a first location where a difference between path metrics is lower than a threshold;

specifying a path which is most likely to be reliable, by back tracing using the Viterbi algorithm in the Viterbi-decoding step;

continuously adding flag signals indicating low reliability to locations preceding the first location; and block-code decoding by regarding the first location with the flag signal and the locations preceding the first location having the flag signals as erasure locations.

13. The method of claim 12, wherein the input digital signal has plural bits composing a symbol and the step of block-code decoding is performed as RS (Reed-Solomon) decoding using the symbol, by regarding a symbol including at least one of the flag signals indicating low reliability as an erasure location.

14. The method of claim 12, wherein the input digital signal has a CRC (Cyclic Redundancy Check) code, the method further comprising the steps of:

CR checking the CRC code of the input digital signal, after the step of specifying a path; and adding the flag signal to a location where an error is detected by the CR checking step.

15. A decoding method according to claim 12, wherein reliability is determined based on a difference between path metrics at each location.

16. The method of claim 12, wherein the input digital signal has plural bits composing a symbol and the step of block-code decoding is performed as RS (Reed-Solomon) decoding using the symbol, by regarding a symbol including at least one of the flag signals indicating low reliability as an erasure location.

17. The method of claim 12, further comprising the step of:

CR checking and adding a second flag signal to a location where an error is detected in the CR checking, between the step of continuously adding flag signals indicating low reliability and the step of block-code decoding;

wherein a location with both the flag signal indicating low reliability and the second flag signal is regarded as an erasure location in the block-code decoding step.

18. The method of claim 12, further comprising the step of:

detecting a cell discard and adding a third flag signal to a location where the cell discard is detected, between the step of continuously adding flag signals and the step of block-code decoding;

wherein a location with both the flag signal indicating low reliability and the third flag signal is regarded as an erasure location in the block-code decoding step.

19. The method of claim 12, further comprising the step of:

calculating an average of reliabilities of first n bits, before the step of selecting a path having a high reliability;

wherein the step of adding a flag signal indicating low reliability adds a flag signal to a location where a difference between path metrics is lower than the average of reliabilities, wherein the block-code decoding step regards the location with the flag signal as an erasure location.

20. The method of claim 19, further comprising the step of:

calculating an average of reliabilities of first n bits, before the step of continuously adding flag signals;

wherein the step of continuously adding flag signals determines a number of flag signals to be added, based on the average of reliabilities of the first n bits.

* * * * *